United States Patent
Choi et al.

(10) Patent No.: US 7,632,719 B2
(45) Date of Patent: Dec. 15, 2009

(54) WAFER-LEVEL CHIP SCALE PACKAGE AND METHOD FOR FABRICATING AND USING THE SAME

(75) Inventors: Seung Yong Choi, Seoul (KR); Min Hyo Park, Seoul (KR); Ji Hwan Kim, Seoul (KR); Rajeev Joshi, San Jose, CA (US)

(73) Assignee: Fairchild Korea Semiconductor, Ltd (KR)

( * ) Notice: Subject to any disclaimer, the term of this patent is extended or adjusted under 35 U.S.C. 154(b) by 11 days.

(21) Appl. No.: 12/350,065

(22) Filed: Jan. 7, 2009

(65) Prior Publication Data
US 2009/0111219 A1    Apr. 30, 2009

Related U.S. Application Data

(62) Division of application No. 10/852,732, filed on May 24, 2004, now abandoned.

(51) Int. Cl.
*H01L 21/00* (2006.01)
(52) U.S. Cl. ............... 438/123; 438/111; 257/E21.514
(58) Field of Classification Search ........... 438/123
See application file for complete search history.

(56) References Cited

U.S. PATENT DOCUMENTS

| | | | |
|---|---|---|---|
| 5,918,113 A * | 6/1999 | Higashi et al. ............. 438/119 |
| 6,190,509 B1 | 2/2001 | Haba |
| 6,223,429 B1 * | 5/2001 | Kaneda et al. ............. 29/832 |
| 6,239,482 B1 | 5/2001 | Fillion et al. |
| 6,252,301 B1 | 6/2001 | Gilleo et al. |
| 6,294,405 B1 | 9/2001 | Higgins, III |
| 6,300,675 B1 | 10/2001 | Tamai |
| 6,336,990 B1 | 1/2002 | Tanaka et al. |
| 6,350,668 B1 | 2/2002 | Chakravorty |
| 6,362,087 B1 | 3/2002 | Wang et al. |
| 6,368,896 B2 | 4/2002 | Farnworth et al. |
| 6,392,305 B1 | 5/2002 | Huang et al. |
| 6,396,557 B1 | 5/2002 | Tajima |
| 6,407,508 B1 | 6/2002 | Kawada et al. |
| 6,417,089 B1 | 7/2002 | Kim et al. |
| 6,441,498 B1 | 8/2002 | Song |
| 6,468,830 B1 | 10/2002 | Carson |

(Continued)

OTHER PUBLICATIONS

John H. Lau, Flip Chip Technologies, McGraw-Hill Companies, Inc., 1996, pp. 301-314, 4567890 BKM BKM 909.

*Primary Examiner*—David A Zarneke
(74) *Attorney, Agent, or Firm*—Kenneth E. Horton; Kirton & McConkie

(57) ABSTRACT

A packaged semiconductor device (a wafer-level chip scale package) containing a conductive adhesive material as an electrical interconnect route between the semiconductor die and a patterned conductive substrate is described. The patterned conductive substrate acts not only as a substrate, but also as a redistribution layer that converts the dense pad layout of the die to a larger array configuration of the solder balls in the circuit board. Using the invention allows the formation of a lower priced chip scale package that also overcomes the restriction of the die size used in die-sized chip packages and the input-output pattern that can be required by the printed circuit board. Thus, the invention can provide a familiar pitch (i.e., interface) to the printed circuit board for any small die.

15 Claims, 20 Drawing Sheets

U.S. PATENT DOCUMENTS

| | | |
|---|---|---|
| 6,518,091 B1 | 2/2003 | Haba |
| 6,518,097 B1 | 2/2003 | Yim et al. |
| 6,528,344 B2 | 3/2003 | Kang |
| 6,555,917 B1 | 4/2003 | Heo |
| 6,566,748 B1 | 5/2003 | Shimizu et al. |
| 6,611,052 B2 | 8/2003 | Poo et al. |
| 6,621,286 B2 | 9/2003 | Takada et al. |
| 6,995,476 B2 | 2/2006 | Hashimoto |
| 2003/0090884 A1 | 5/2003 | Lee et al. |
| 2004/0191955 A1 | 9/2004 | Joshi et al. |
| 2005/0012225 A1 | 1/2005 | Choi et al. |
| 2005/0176233 A1 | 8/2005 | Joshi et al. |

* cited by examiner

WAFER-LEVEL CHIP SCALE PACKAGE AND METHOD FOR FABRICATING AND USING THE SAME

CROSS-REFERENCE TO RELATED APPLICATIONS

This application is a divisional application of U.S. application Ser. No. 10/852,732, which is a continuation-in-part of priority of U.S. patent application Ser. No. 10/731,453, which is a continuation-in-part of Ser. No. 10/618,113, which is a continuation in part of U.S. patent application Ser. No. 10/295,281, which claims priority of Korean Patent Application No. KR 01-71043, the entire disclosures of which are incorporated herein by reference.

FIELD OF THE INVENTION

The invention generally relates to methods for fabricating integrated circuits (ICs) and semiconductor devices and the resulting structures. Specifically, the invention relates to semiconductor packages and methods for fabricating and using such packages. More particularly, the invention relates to wafer level chip scale packages and methods for fabricating and methods for using such packages.

BACKGROUND OF THE INVENTION

Recent advancements in the electronics industry, especially with personal computers (PC), mobile phones, and personal data assistants (PDA), have triggered a need for light, compact, and multi-functional power systems that can process large amounts of data quickly. These advancements have also triggered a reduction in the size of semiconductor chips and the packaging used for theses chips.

The semiconductor chips typically have conductive pads formed at the top surface of the silicon substrate containing the IC. Wire bonding is used to connect the conductive pads on the substrate to corresponding pads on a package substrate. The increasing complexity of the circuitry in the IC has required the conductive pads to be formed closer together. With the bond pads narrower, the length of the wire (in the wire bonding) needs to be longer and width narrower which unfortunately induces a greater amount of inductance and thereby reduces the speed of the circuitry.

One type of packaging that has been recently used is wafer-level chip size packaging (WLCSP). See, for example, U.S. Pat. Nos. 6,187,615 and 6,287,893, the disclosures of which are incorporated herein by reference.

In general, to fabricate WLCSP, a wafer is processed and then packaged by a photolithography process and a sputtering process. This method is easier than general packaging processes that use die bonding, wire bonding, and molding. Processes for WLCSP also have other advantages when compared to general packaging processes. First, it is possible to make solder bumps for all chips formed on a wafer at a single time. Second, a wafer-level test on the operation of each semiconductor chip is possible during WLSCP processes. For these—and other reasons—WLCSP can be fabricated at a lower cost than general packaging.

FIGS. 1-3 illustrate several known wafer-level chip scale packages. As shown in FIG. 1, chip pads 40 are formed of a metal such as aluminum on a silicon substrate 5. A passivation layer 10 is formed to expose a portion of each of the chip pads 40 on the silicon substrate 5 while protecting the remainder of the silicon substrate 5. A first insulating layer 15 is formed over the passivation layer 10 and then a re-distribution line (RDL) pattern 20 (which re-distributes electrical signals from the bond pad 40 to solder bump 35) is formed over portions of the first insulating layer 15 and the exposed chip pads 40. A second insulating layer 25 is formed on portions of the RDL pattern 20 while leaving portions of the RDL pattern 20 exposed. Under bump metals (UBM) 30 are formed between solder bumps 35 and the exposed portions of the RDL pattern 20. The RDL pattern 20 contains inclined portions on the first insulating layer 15 near the chip pads 40. In these areas, short circuits can occur and the pattern 20 can crack and deform in these areas due to stresses.

As depicted in FIG. 2, package 50 contains an RDL pattern 54 that adheres to a solder connection 52 in a cylindrical band. Such a configuration has several disadvantages. First, the contact area between the RDL pattern 54 and the solder connection 52 is minimal, thereby deteriorating the electrical characteristics between them. Second, short circuits may occur due to the stresses in the contact surface between the RDL pattern 54 and the solder connection 52. Third, the solder connection 52—which is connected with a solder bump 58 formed on a chip pad 56—is exposed to the outside of the package 50, i.e., to air. Thus, there is a higher possibility that moisture penetrates into the solder connection 52 and decreases the reliability of the solder connection 52. Fourth, the package 50 is completed only by carrying out many processing steps and, therefore, manufacturing costs are high.

As shown in FIG. 3, package 60 contains a RDL pattern 76 that is electrically connected with a chip pad 72 via a connection bump 74. The RDL pattern 76 is, however, inclined on the connection bump 74, causing cracks therein due to stresses as described above. As well, the connection bump 74 is made by a plating process and is formed of aluminum, copper, silver, or an alloy thereof. Accordingly, the package 60 is not easy to manufacture.

Other problems exist with conventional WLSCP. Often, such packaging uses UMB (i.e., layer 30 in FIG. 1) and two insulating layers (i.e., layers 15 and 25 in FIG. 1) that are made of polymeric materials such as polyimide and benzo-cyclobutene (BCB). Such structures are complicated to manufacture and very expensive because of materials and equipment used. As well, the coefficient of thermal expansion (CTE) between the various layers can induce thermal stresses into the ICs and damage the ICs during high temperature curing of these polymeric materials.

As well, conventional packaging methods have used a conductive film or paste in flip chip packaging. See, for example, U.S. Pat. Nos. 5,9494,142, 6,509,634, and 6,518,097, the disclosures of which are incorporated herein by reference. Generally, these methods used a gold bump on a silicon die and then bonded it to a substrate (usually ceramic) using the conductive film or paste using ultrasonic bonding. Such methods, however, suffer from a high cost and poor reliability.

Further, the trend of semiconductor packaging including WL-CSP is to use smaller, lighter and thinner form factors that enable the manufacture of smaller semiconductor devices. The use of smaller form factors in a WL-CSP packaging with small die and large I/O, however, could result in manufacturing challenges. One of these challenges is the alignment of solder balls on a die 501 (i.e., small pitch) to the alignment of lands/pads on the printed circuit board 502 (i.e. large pitch) as illustrated in FIG. 31.

SUMMARY OF THE INVENTION

The invention provides a packaged semiconductor device (a wafer-level chip scale package) containing a conductive adhesive material as an electrical interconnect route between the semiconductor die and a patterned conductive substrate. The patterned conductive substrate acts not only as a substrate, but also as a redistribution layer that converts the dense pad layout of the die to a larger array configuration of the solder balls in the circuit board. Using the invention allows the formation of a lower priced chip scale package that also overcomes the restriction of the die size used in die-sized chip packages and the input-output pattern that can be required by the printed circuit board. Thus, the invention can provide a familiar pitch (i.e., interface) to the printed circuit board for any small die.

BRIEF DESCRIPTION OF THE DRAWINGS

FIGS. 1-39 are views of one aspect of the devices and methods of making the devices according to the invention, in which:

FIG. 1 is a cross-sectional view of a conventional wafer-level chip scale package;

FIG. 2 is a cross-sectional view of another conventional wafer-level chip scale package;

FIG. 3 is a cross-sectional view of another conventional wafer-level chip scale package;

FIG. 4 is a cross-sectional view showing a stage in a method of fabricating a wafer-level chip scale package according to an aspect of the invention;

FIG. 5 is a cross-sectional view showing a stage in a method of fabricating a wafer-level chip scale package according to an aspect of the invention;

FIG. 6 is a cross-sectional view showing a stage in a method of fabricating a wafer-level chip scale package according to an aspect of the invention;

FIG. 7 is a cross-sectional view showing a stage in a method of fabricating a wafer-level chip scale package according to an aspect of the invention;

FIG. 8 is a cross-sectional view showing a stage in a method of fabricating a wafer-level chip scale package according to an aspect of the invention;

FIG. 9 is a cross-sectional view showing a stage in a method of fabricating a wafer-level chip scale package according to an aspect of the invention;

FIG. 10 is a cross-sectional view showing a stage in a method of fabricating a wafer-level chip scale package according to an aspect of the invention;

FIG. 11 is a cross-sectional view of a wafer-level chip scale package according to one aspect of the invention;

FIGS. 12-15 illustrate stages in a method of fabricating a wafer-level chip scale package in one aspect of the invention;

FIG. 16 depicts another stage in a method of fabricating a wafer-level chip scale package in one aspect of the invention;

FIG. 17 depicts a process for making a wafer-level chip scale package in another aspect of the invention;

FIGS. 18-25 illustrate stages in a method of fabricating a wafer-level chip scale package in one aspect of the invention;

FIG. 26 depicts conductive particles that can be used in one aspect of the invention;

FIG. 27 depicts a wafer-level chip scale package in one aspect of the invention;

FIG. 28 shows stages in a method of fabricating a wafer-level chip scale package in one aspect of the invention;

FIGS. 29-30 illustrate stages in a method of fabricating a wafer-level chip scale package in one aspect of the invention;

FIG. 31 illustrates a problem with conventional wafer-level chip scale packaging;

FIGS. 32-33 illustrate stages in a method of fabricating a wafer-level chip scale package in one aspect of the invention;

FIG. 34 illustrates a potion of a wafer-level chip scale package in one aspect of the invention;

FIGS. 35-36 illustrate stages in a method of fabricating a wafer-level chip scale package in one aspect of the invention;

FIG. 37 illustrates a potion of a wafer-level chip scale package in one aspect of the invention;

FIG. 38 illustrates a stage in a method of fabricating a wafer-level chip scale package in one aspect of the invention; and FIG. 39 illustrates a wafer-level chip scale package in one aspect of the invention.

FIGS. 1-39 presented in conjunction with this description are views of only particular—rather than complete—portions of the devices and methods of making the devices according to the invention. Together with the following description, the Figures demonstrate and explain the principles of the invention. In the Figures, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their descriptions will be omitted.

DETAILED DESCRIPTION OF THE INVENTION

The invention now will be described more fully with reference to the accompanying drawings, in which one aspect of the invention is shown. This invention may, however, be embodied in many different forms and should not be construed as being limited to the aspects set forth herein. Rather, these aspects are provided so that this disclosure will be thorough and complete and will fully convey the concept of the invention to those skilled in the art. Although the invention is described with respect to IC chips, the invention could be used for other devices where packaging is needed, i.e., silicon MEMS devices, LCD displays, optoelectonics, and the like.

Figure 4:
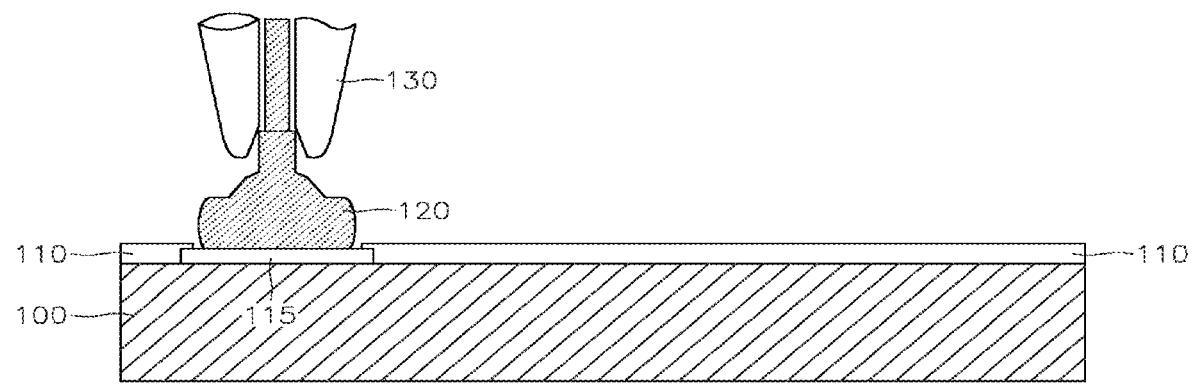

FIGS. 4 through 10 illustrate one aspect of the invention for fabricating a wafer-level chip scale package containing a re-distributed line (RDL) pattern that is not inclined between the bottom of a solder bump and the top surface of a chip pad. Referring to FIG. 4, a substrate (or chip) 100 is prepared on which a passivation layer 110 and a chip pad 115 are formed. The substrate 100 can be any known semiconductor substrate known in the art, including "compound" semiconductors and single crystal silicon. The passivation layer 110 can be made of any dielectric material known in the art, such as silicon nitride, silicon oxide, or SOG.

Then, the chip pad 115 is formed on the upper surface of substrate 100. First, a portion of passivation layer in this area is removed by a conventional masking and etching process. Then, the metal for the chip pad 115 is blanket deposited and the portions of the metal layer not needed for the bond pad are removed by etching or planarization. The chip pad 115 can be made of conductive material, such as metals and metal alloys. In one aspect of the invention, the chip pad comprises aluminum.

Figure 5:
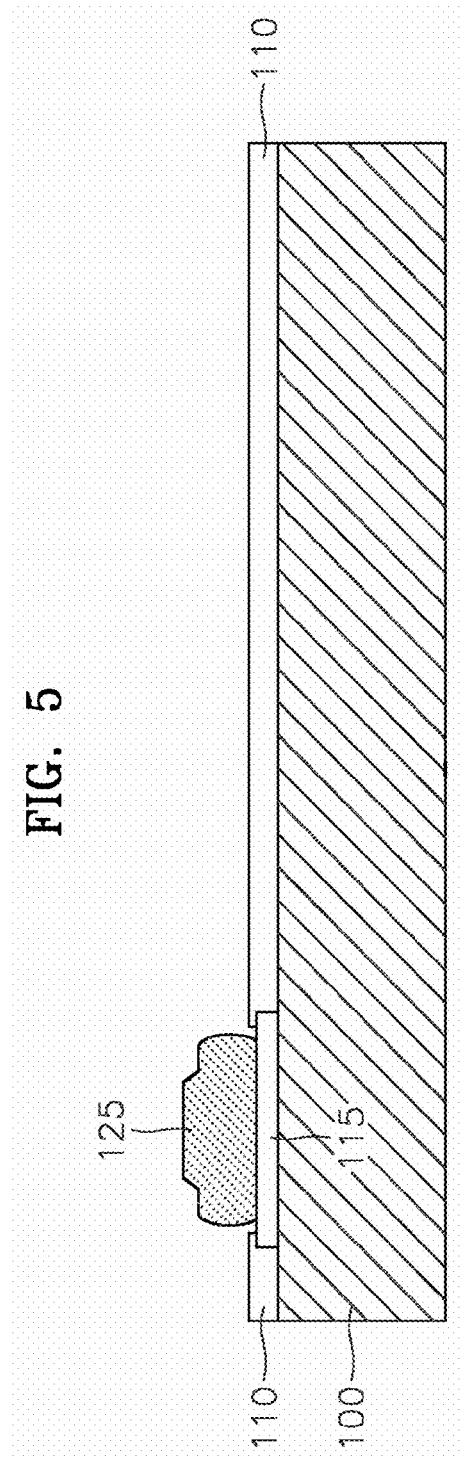

A wire 120 is next attached to the chip pad 115 using a capillary 130. As shown in FIG. 5, the bottom of the wire 120 is bonded to the chip pad 115. Then a coining process is performed to press the wire 120 under a predetermined pressure, thereby forming a coined stud bump 125. By using the capillary 130, the coined stud bump 125 can be formed with a simple structure and with a simple manufacturing process.

Figure 6:
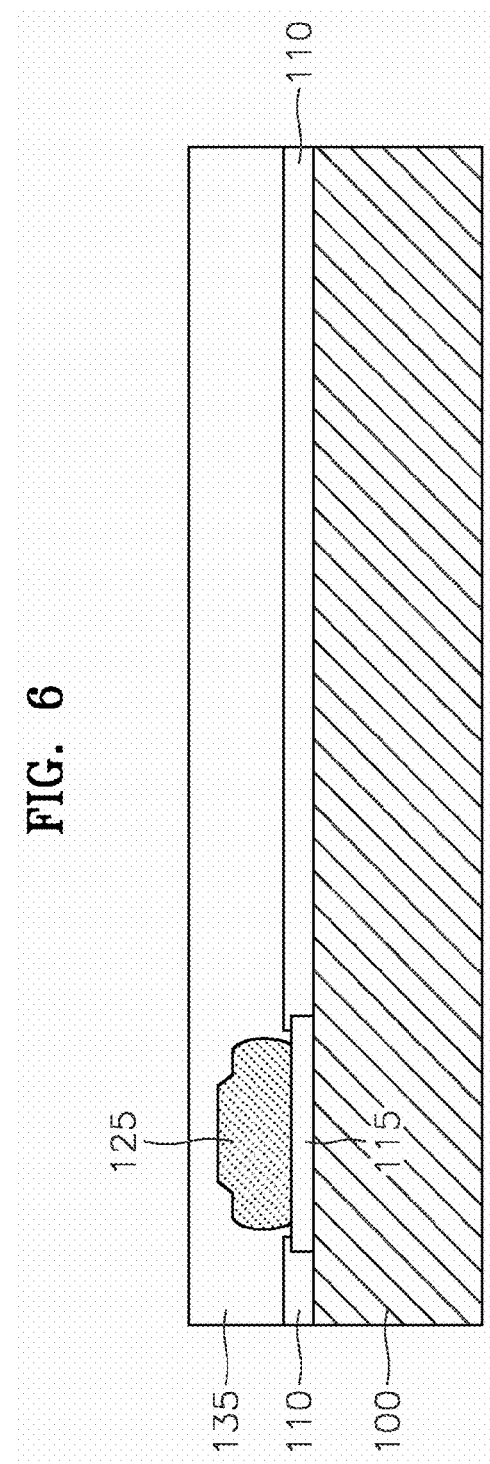
Figure 7:
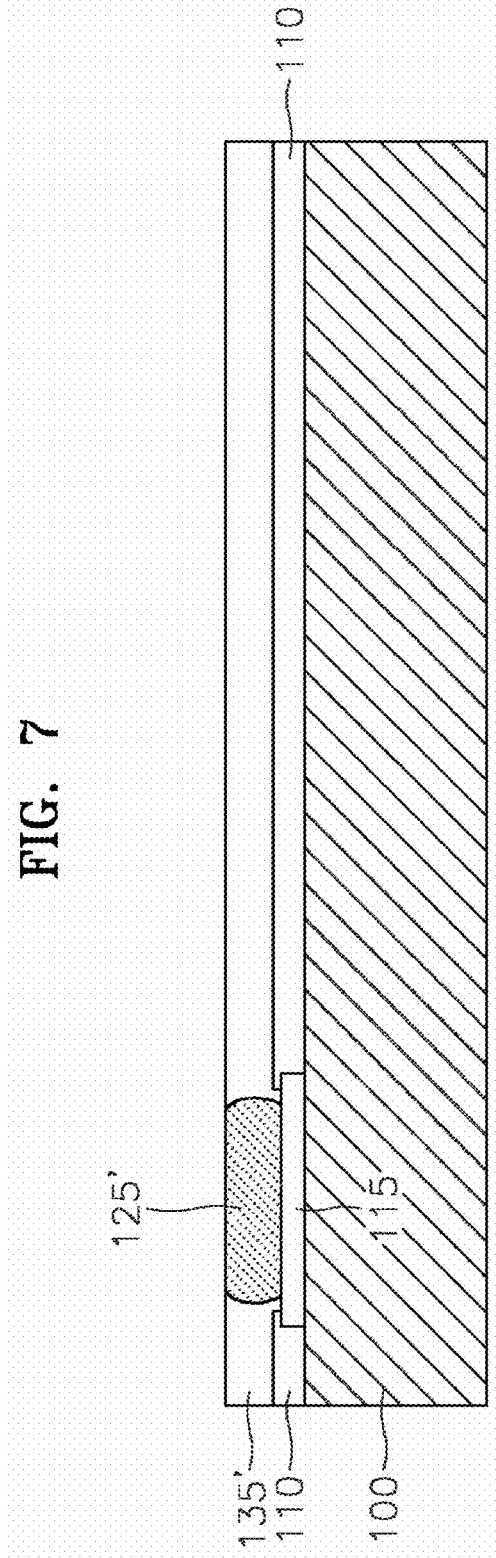

As depicted in FIG. 6, a first insulating layer 135 is then deposited to cover the coined stud bump 125 and passivation layer 110. In this aspect of the invention, the first insulating layer 135 is formed of a dielectric polymer material such as BCB, polyimide (PI), and epoxy molding compound (EMC). As illustrated in FIG. 7, the first insulating layer 135 and the coined stud bump 125 are planarized using conventional processing. In the planarization process, a stud bump 125' and a first insulating layer 135' as formed. In one aspect of the invention, a chemical mechanical polishing (CMP) process is used to planarize the first insulating layer 135 and the stud bump 125.

Figure 1:
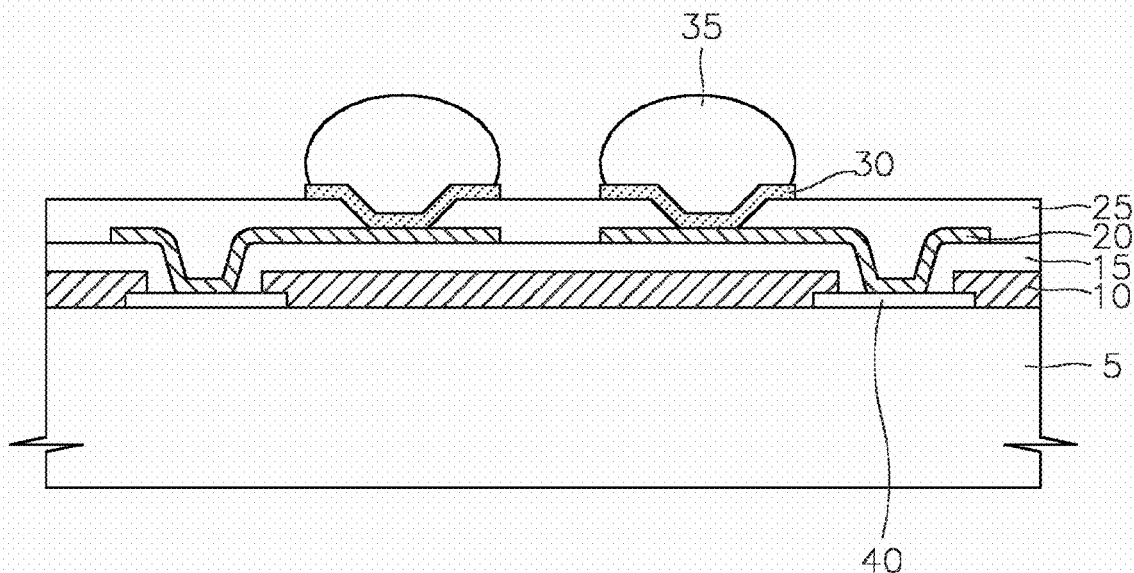
Figure 2:
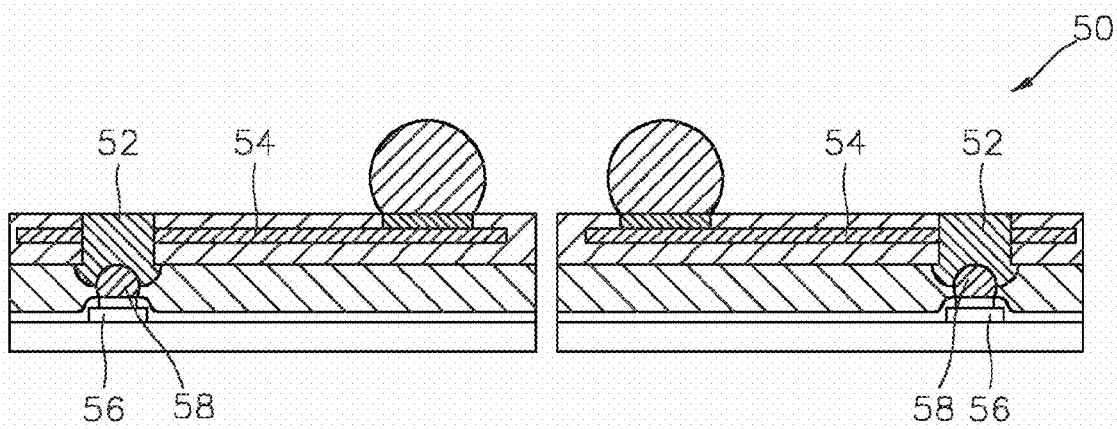
Figure 3:
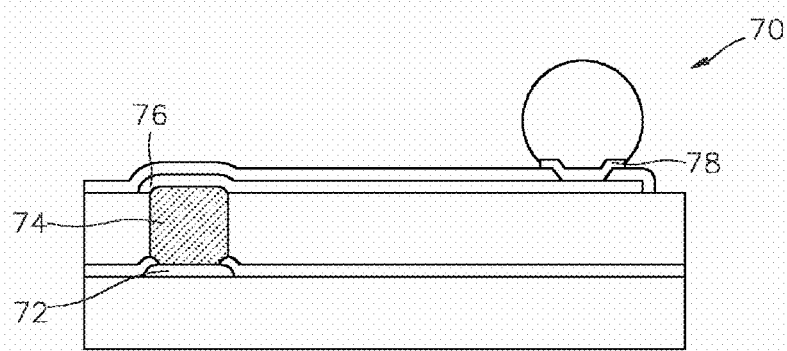
Figure 8:
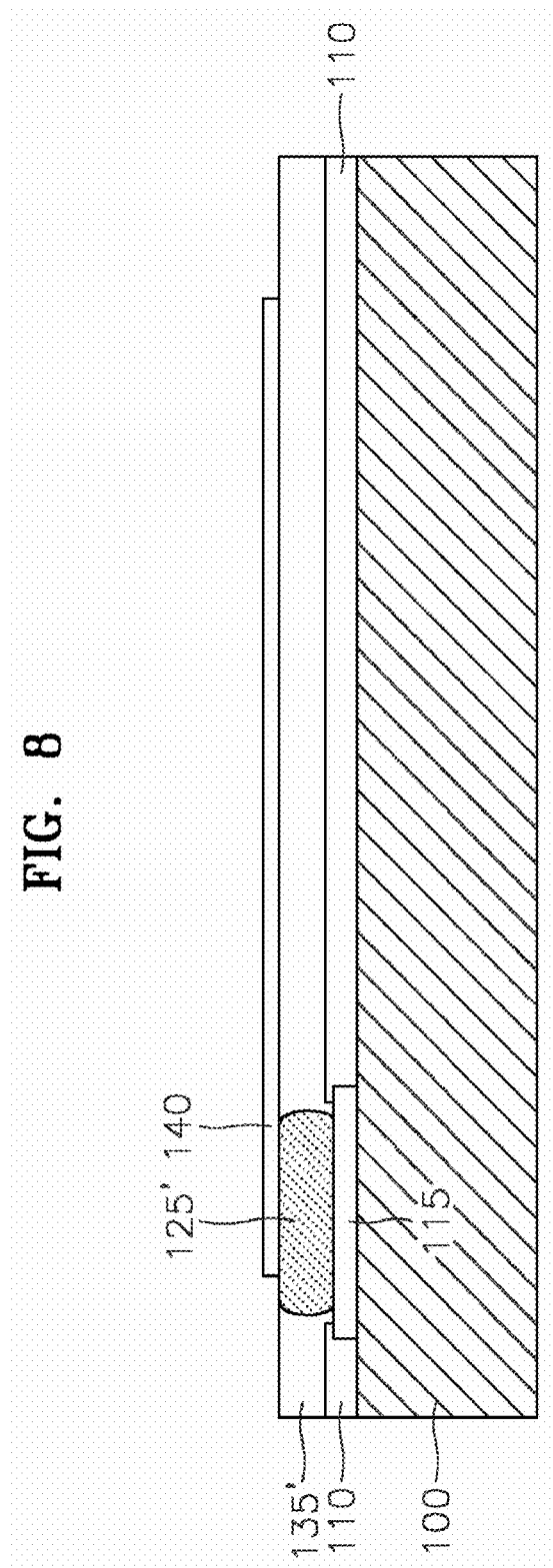

As shown in FIG. 8, a re-distributed line (RDL) pattern 140 is formed on the stud bump 125' and the first insulating layer 135'. The RDL pattern 140 electrically connects the stud bump 125' and the solder bump that is formed during subsequent processing (as described below). The RDL pattern is formed by blanket depositing a metal layer and then removing—typically by masking and etching—the portions of the metal layer not needed for the RDL pattern 140. The RDL pattern 140 can contain any electrically conductive material, such as metals and metal alloys. Examples of such metal and metal alloys include Cu, Al, Cr, NiV, and Ti. In one aspect of the invention, the RDL comprises a composite layer of Cu, Al, Cr, and Cu, or a material selected from NiV and Ti. In conventional wafer-level chip scale package as shown in FIG. 1, the RDL pattern 20 was formed of Al, NiV, Cu, NiV, and Cu that are sequentially deposited on the chip pad 40. Such a configuration has poor adhesive characteristics and reliability, is not easy to fabricate, and high manufacturing costs.

Figure 9:
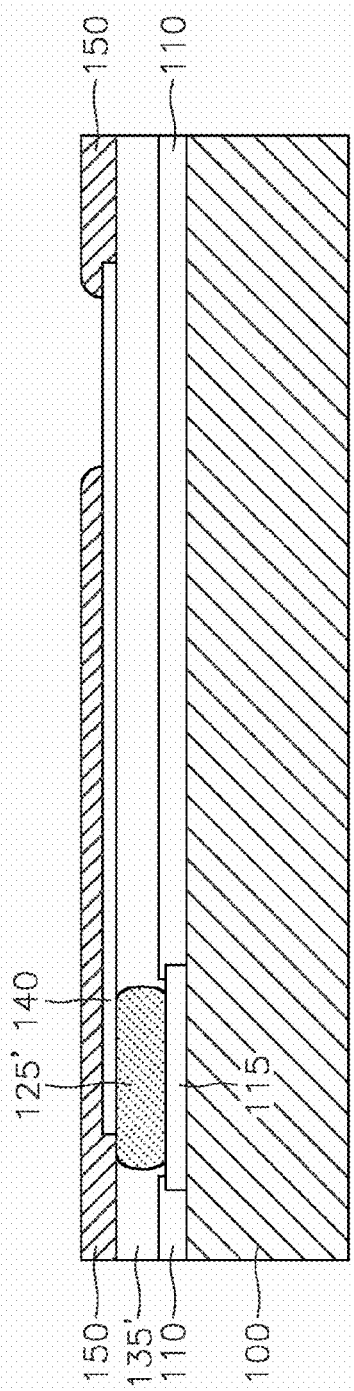
Figure 10:
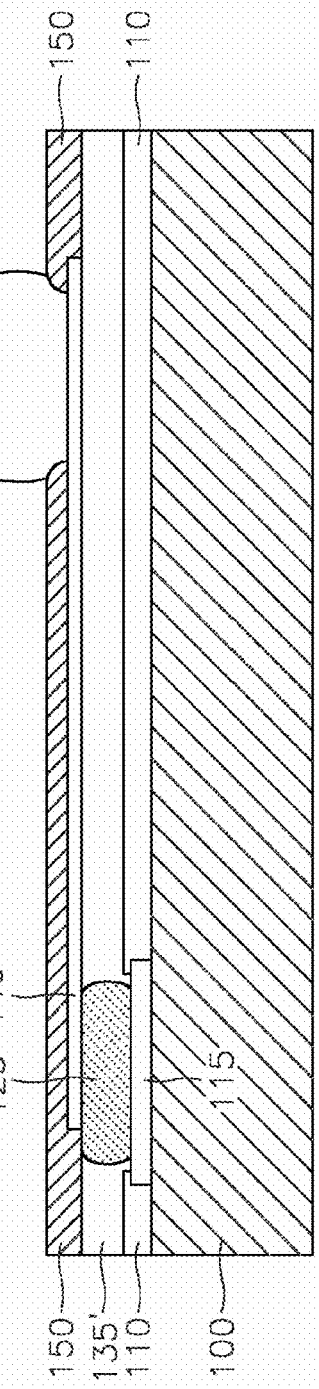

As depicted in FIG. 9, a second insulating layer 150 is then formed to cover the RDL pattern 140 and the first insulating layer 135'. A portion of the second insulating layer 150 is removed—typically by masking and etching—to expose a portion of the RDL pattern 140 to which a solder bump is later attached. As shown in FIG. 10, a solder bump 160 is then attached to the exposed portion of the RDL pattern 140 as known in the art.

The stud bump comprises any conductive material such as metal and metal alloys. In one aspect of the invention, the stud bump comprises gold (Au) or copper (Cu).

The wafer-level chip scale package 1000 is illustrated in FIG. 10. The silicon substrate 100 contains an IC (not shown) and chip pad 115 which extends into the passivation layer 110 and is encircled by the passivation layer 110. Electrical signals from the IC contained in substrate 100 are transmitted through chip pad 115, through RDL pattern 140, to solder bump 160, and then to the outside of the packaged semiconductor device (i.e., to a circuit board).

In the device of FIG. 10, the first insulating layer 135' encircles and covers the stud bump 125'. Since the top surface of the first insulating layer 135' and stud bump 125' are coplanar in this aspect of the invention, the RDL pattern 140 may be formed as a substantially planar layer without an inclined portion. Therefore, cracks in the RDL pattern 140 due to stresses are prevented.

The RDL pattern 140 shown in FIG. 10 is illustrated as on only a portion of the upper surface of the stud bump 125'. In another aspect of the invention, the RDL pattern can be formed to cover the entire stud bump 125', thus enhancing the electrical characteristics and reliability of the wafer-level chip scale package 1000.

The RDL pattern 20 of FIG. 1 contains an inclined portion in the conventional wafer-level chip scale package. Accordingly, it is extremely difficult to form a thick first insulating layer 15 in FIG. 1. In this aspect of the invention, however, the first insulating layer 135' in FIG. 10 is formed as thick layer.

Figure 11:
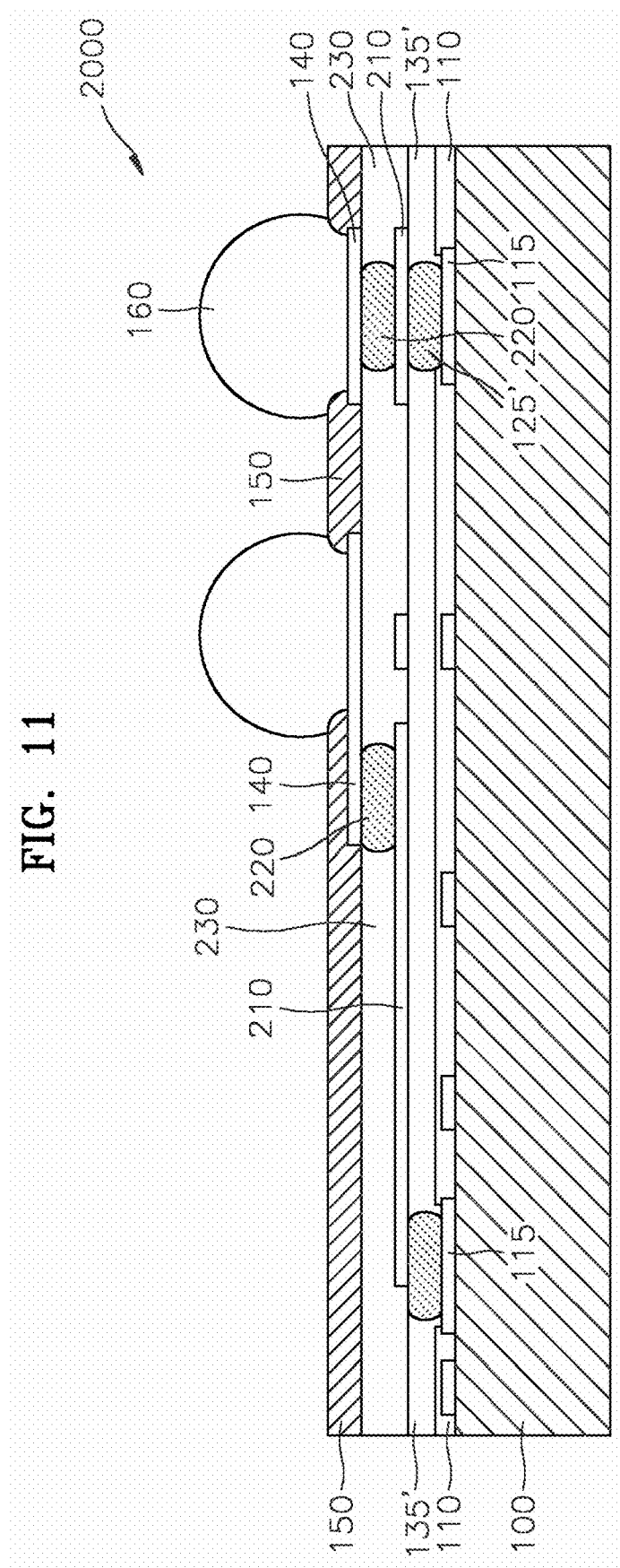

FIG. 11 illustrates another aspect of the invention where a wafer-level chip scale package has a two-layer RDL pattern. A wafer-level chip scale package 2000 contains: a substrate (or chip) 100; a passivation layer 110; chip pads 115; stud bumps 125' that are formed on chip pads 115 and are encircled by a first insulating layer 135'; intermediate RDL pattern 210 that connects the stud bumps 125' and intermediate stud bumps 220; an intermediate insulating layer 230 that insulates the intermediate RDL pattern 210; RDL pattern 140 that connects the intermediate stud bumps 220 and solder bumps 160; a second insulating layer 150 that insulates the RDL patterns 140; and solder bumps 160 that are attached to a portion of each of the RDL pattern 140.

Components not described in FIG. 11 are the same as those components explained with reference to FIG. 10. The same reference numerals in FIGS. 10 and 11 denote the same elements that have substantially the same functions and are formed of the same materials and in substantially the same manner. The structure, functions, materials, and effects of the intermediate stud bumps 220, the intermediate RDL pattern 210 and the intermediate insulating layer 230 are substantially the same as those of the stud bump 125, the RDL pattern 140, and the second insulating layer 150, respectively. The intermediate stud bumps 220 connect the intermediate RDL pattern 210 and the RDL pattern 140. Each intermediate RDL pattern 210 is formed at the bottom of each intermediate stud bump 220. The intermediate insulating layer 230 exposes a portion of the intermediate RDL pattern 210 so it can be connected with the intermediate stud bumps 220.

In another aspect of the invention, additional intermediate stud bumps, intermediate RDL patterns, and intermediate insulating layers may be formed to make three (or more) layer RDL pattern rather than the two layer RDL pattern illustrated in FIG. 11.

In the aspects of the invention described above, it is possible to reduce or prevent an inclined portion of a RDL pattern in the art between a solder bump and a chip pad. Such a configuration suppresses cracks in the RDL pattern, even where an underlying insulating layer has a large thickness. Further, a stud bump can be easily and inexpensively formed using a capillary.

Figure 15:
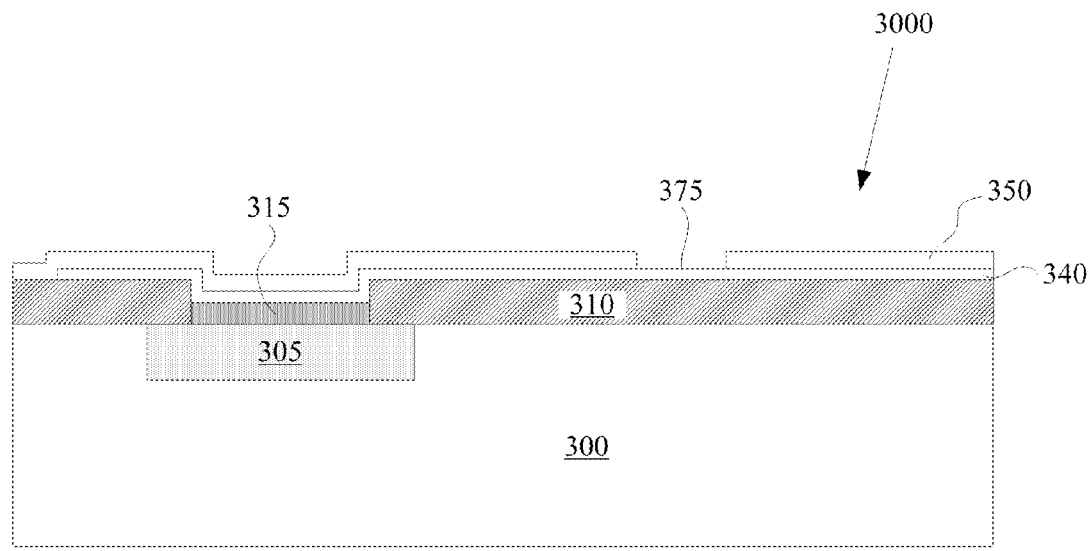
Figure 16:
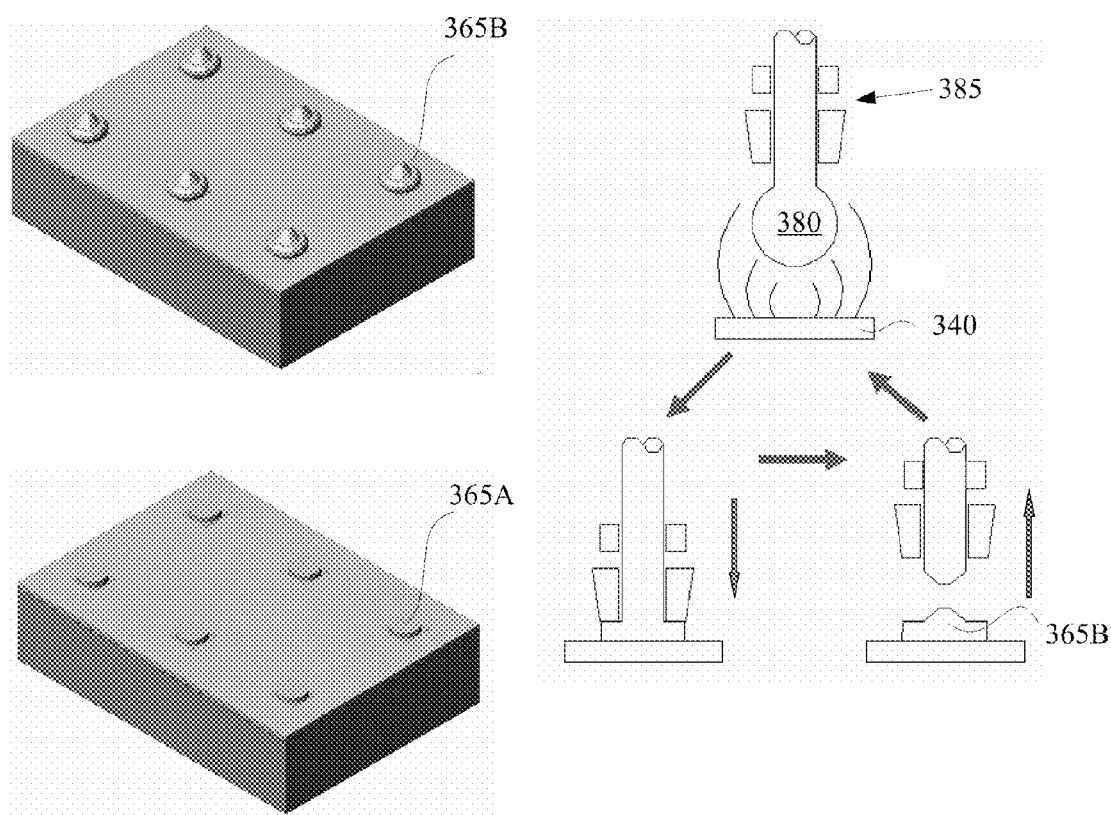
Figure 17:
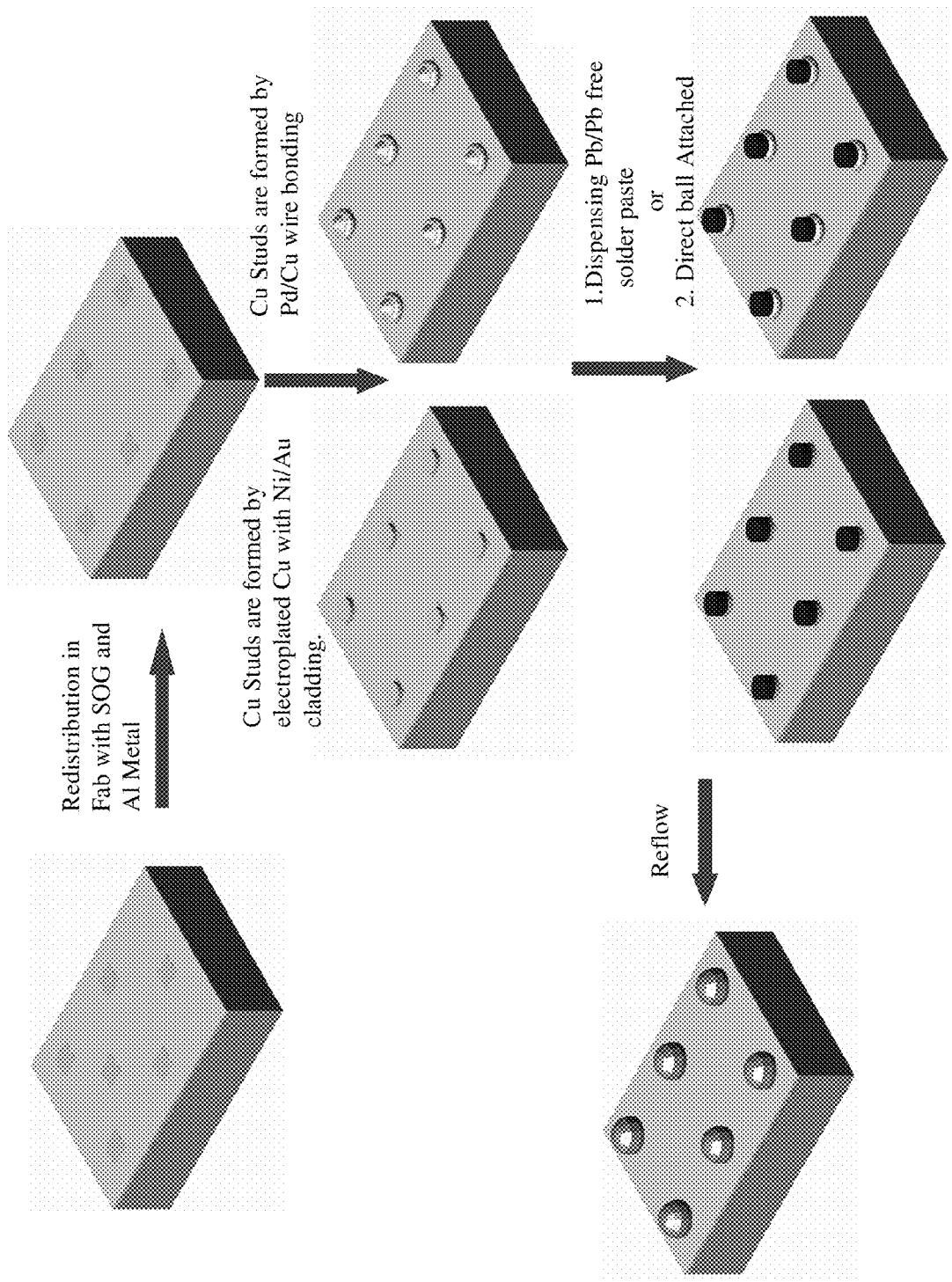

In another aspect of the invention, the wafer level chip scale package is manufactured in the manner depicted in FIGS. 12-17 so as to not contain a UBM between the chip pad the RDL pattern and to contain a single non-polymeric insulating layer. In this aspect of the invention, and as depicted in FIG. 17, the bond pads are first redistributed (as depicted in more detail in FIGS. 12-15). Then, the stud bumps are formed on the wafer (as depicted in more detail in FIG. 16). The solder balls are then attached to the stud bumps, either directly or by using solder paste, and the solder balls are re-flowed. The resulting packaged semiconductor device can then be mounted on a circuit board as known in the art.

Figure 12:
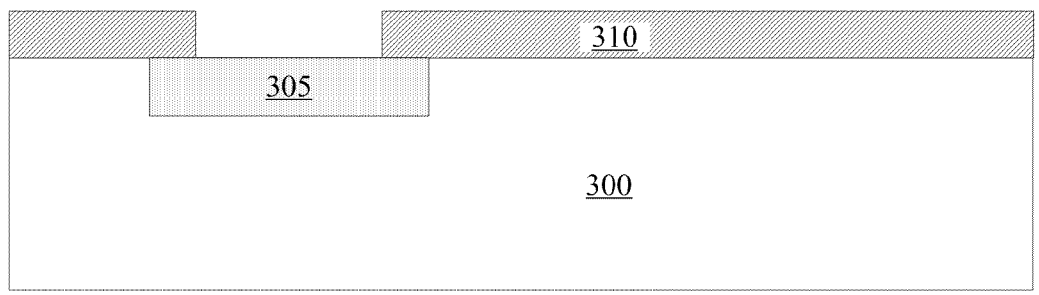
Figure 13:
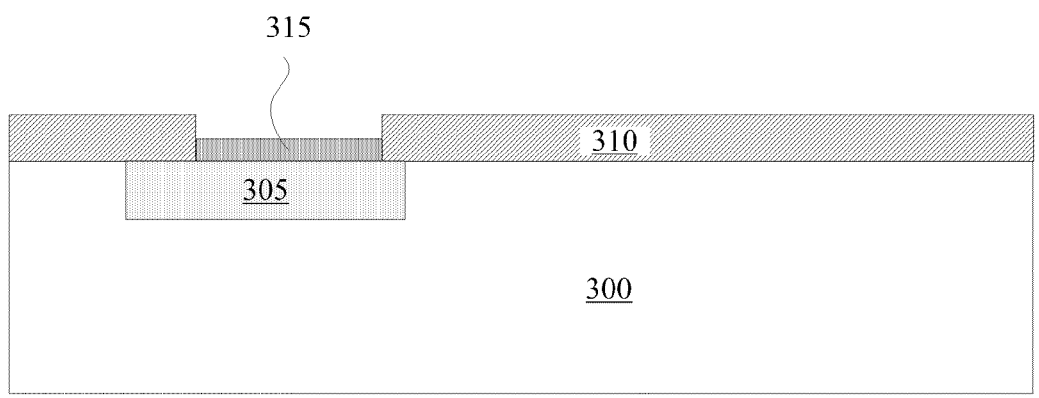

In this aspect of the invention, and as illustrated in FIGS. 12-13, a substrate (or chip) 300 (substantially similar to substrate 100) containing IC 305 is obtained. A passivation layer 310 (substantially similar to passivation layer 110) is then formed on substrate 300. A portion of the passivation layer is then removed and a chip pad 315 (substantially similar to chip pad 115) is formed in that exposed portion. The methods used for these processes are substantially similar to those described above.

Figure 14:
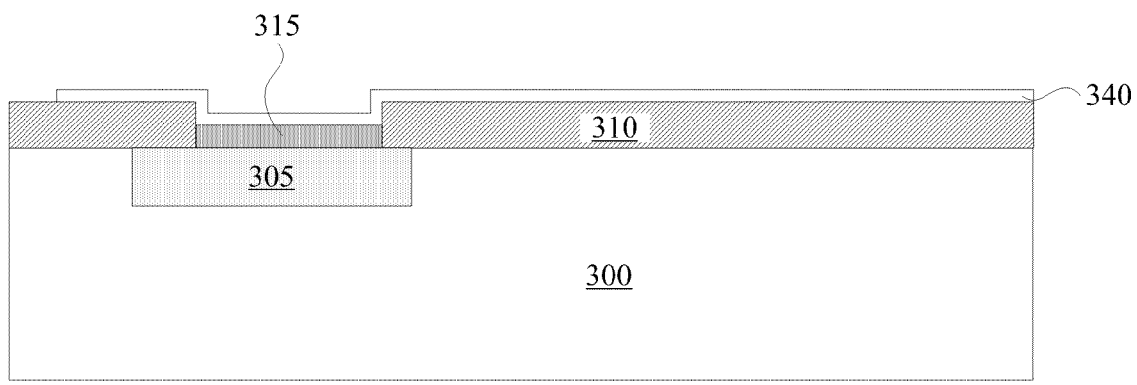

Next, as depicted in FIG. 14, a re-distributed (RDL) pattern 340 is formed on directly on the chip pad 315 and the passivation layer 310. The RDL pattern 340 electrically connects the chip pad 315 and the solder bump 365 that is formed during subsequent processing (as described below). The RDL pattern 340 is formed by blanket depositing a metal layer and then removing—typically by masking and etching—the portions of the metal layer not needed for the RDL pattern 340.

The RDL pattern 340 can contain any electrically conductive material, such as metals and metal alloys. Examples of such metal and metal alloys include Cu, Al, Cr, NiV, and Ti. In one aspect of the invention, the RDL pattern comprises Al.

Next, as shown in FIG. 15, an insulating layer 350 is formed to cover the RDL pattern 340. In this aspect of the invention, the material for the insulating layer is blanket deposited on the RDL pattern 340. A masking and etching process is then used to remove a portion of this insulating material in the area of region 375 (where stud bumps 365 will later be formed).

The material for the insulating layer 350 does not comprise a polymer material like BCB, PI, and EMC. As described above, such materials are often used in conventional WLCSP. To form such layers, however, the structure containing the material is subjected to a high temperature heating process. This heating is necessary to cure the polymer material. Unfortunately, such a high temperature heating process damages the structure underlying the polymeric material including the IC 305 in substrate 300.

In this aspect of the invention, the insulating layer 350 is not made of polymeric materials. Rather, the insulating layer 350 is made of dielectric non-polymeric materials. Examples of such non-polymeric dielectric materials include silicon nitride, silicon oxide, and silicon oxynitride. Such materials can be deposited by any known method in the art.

In this aspect of the invention, only a single layer is used as the redistribution layer. In the aspect of the invention shown in FIGS. 4-10, a UBM and a metal layer are used to redistribute the electrical signal from the chip pad 115 to the stud bump 160. By using only a metal layer in this aspect of the invention, the cost of the manufacturing the UBM can be eliminated. Thus, this aspect of the invention uses only a single conductive layer as the RDL pattern in the WLSCP.

As depicted in FIG. 16, the stud bumps are then formed on the exposed portion of the RDL pattern 340 (in the area 375). The stud bumps 365A can be formed by electroplating the material for the stud bumps and with a cladding as known in the art. In this aspect of the invention, the material for the study bumps is Cu and the cladding is a Ni/Au alloy.

Alternatively, the stud bumps 365B can be formed by a wire bonding process. In this aspect of the invention, a coated wire 380 is attached to the RDL pattern 340 using a capillary 385. As shown in FIG. 16, the bottom of the wire 380 is first bonded to the metal of the RDL pattern 340. Then a coining process is performed to press the wire 380 under a predetermined pressure to form a coined stud bump 365B. By using the capillary, the coined stud bump 365B can be formed with a simple structure and with a simple manufacturing process. In one aspect of the invention, the material for the wire comprises Cu and the coating comprises Pd.

Finally, as shown in FIG. 17, the solder balls are then attached to the stud bumps, either directly or by using solder paste, and the solder balls are re-flowed. Both of these processes are performed using conventional processing that is known in the art.

In yet another aspect of the invention, the wafer level chip scale package is manufactured in the manner depicted in FIGS. 18-30. Using this process eliminates the steps of dispensing the solder and reflowing the solder bumps, and optionally eliminates the use of a redistribution trace. In this aspect of the invention, an adhesive film or paste is used between the chip and the substrate.

Figure 18:
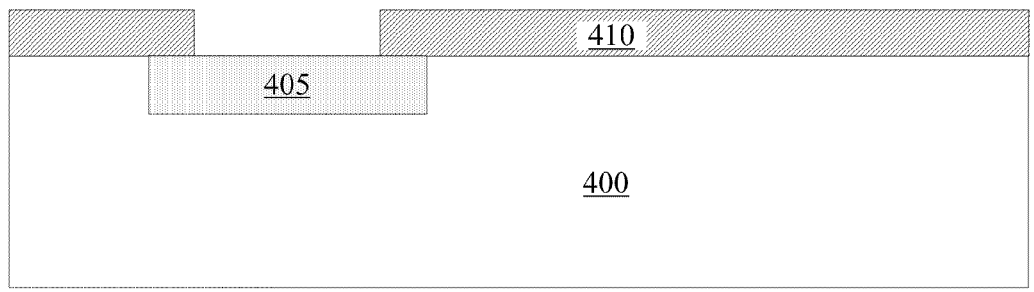
Figure 19:
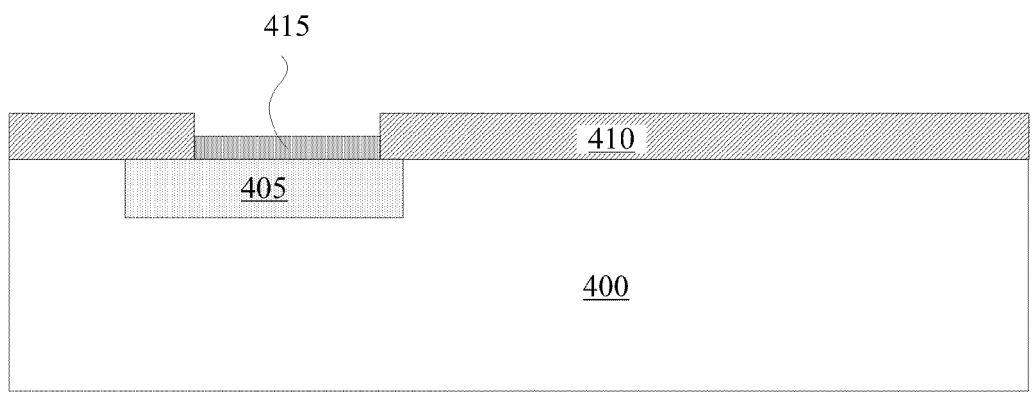

In this aspect of the invention, and as illustrated in FIGS. 18-19, a substrate (or chip) 400 (substantially similar to substrate 100) containing IC 405 is provided. A passivation layer 410 (substantially similar to passivation layer 110) is then formed on chip 400. A portion of the passivation layer is then removed and a chip pad 415 (substantially similar to chip pad 115) is formed in that exposed portion. The methods used for these processes are substantially similar to those described above.

Figure 20:
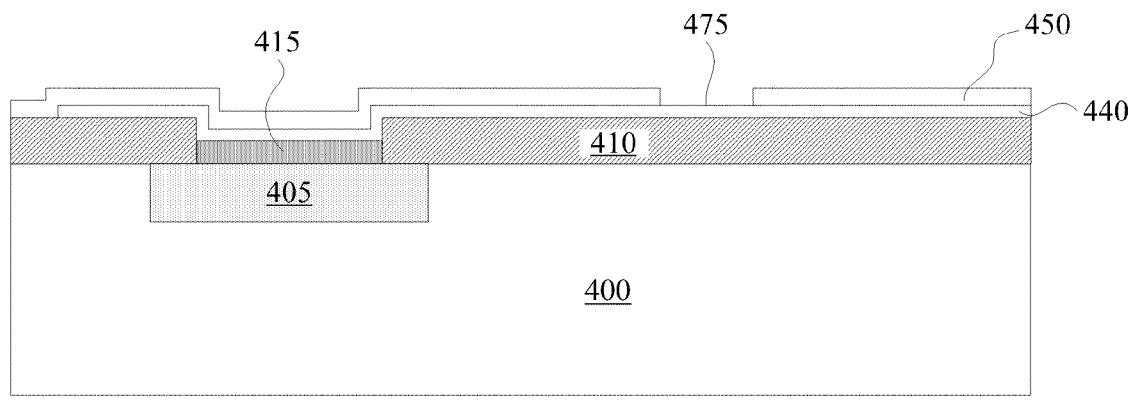

Next, as depicted in FIG. 20, a re-distributed (RDL) pattern 440 is optionally formed on directly on the chip pad 415 and the passivation layer 410. The semiconductor package can be made with or without the RDL pattern 440 depending on whether re-distribution is necessary. When used, the RDL pattern 440 electrically connects the chip pad 415 and the solder bump 465 that is formed during subsequent processing (as described below). The RDL pattern 440 is formed by blanket depositing a metal layer and then removing—typically by masking and etching—the portions of the metal layer not needed for the RDL pattern 440. The RDL pattern 440 can contain any electrically conductive material, such as metals and metal alloys. Examples of such metal and metal alloys include Cu, Al, Cr, NiV, and Ti. In one aspect of the invention, the RDL pattern comprises Al.

Next, when the RDL pattern 440 is used, an insulating layer 450 is formed to cover the RDL pattern 440 as shown in FIG. 20. In this aspect of the invention, the material for the insulating layer is blanket deposited on the RDL pattern 440. A masking and etching process is then used to remove a portion of this insulating material in the area of region 475 (where stud bump 465 will later be formed).

The material for the insulating layer 450 does not comprise a polymer material like BCB, PI, and EMC. As described above, such materials are often used in conventional WLCSP. To form such layers, however, the structure containing the material is subjected to a high temperature heating process. This heating is necessary to cure the polymer material. Unfortunately, such a high temperature heating process damages the structure underlying the polymeric material including the IC 405 in substrate 400.

In this aspect of the invention, the insulating layer 450 is not made of polymeric materials. Rather, the insulating layer 450 is made of dielectric non-polymeric materials. Examples of such non-polymeric dielectric materials include silicon nitride, silicon oxide, and silicon oxynitride.

Figure 21:
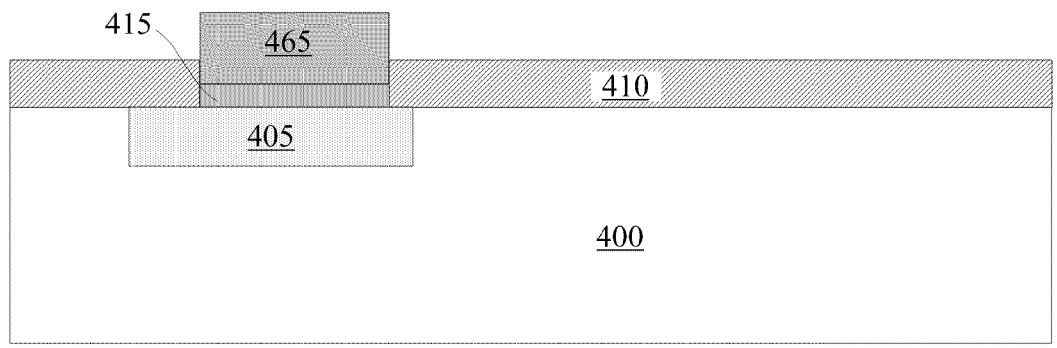
Figure 22:
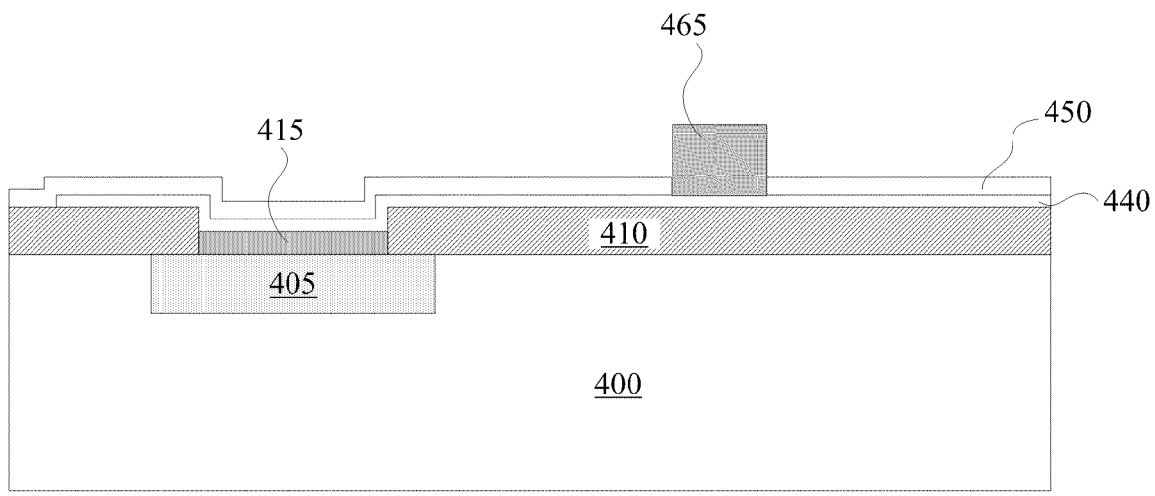

Then studs (or stud bumps) 465 are formed on the structures depicted in FIG. 19 (without a redistribution layer) and FIG. 20 (with a redistribution layer). As depicted in FIGS. 21 and 22, the studs 465 are respectively formed on the chip pad 415 and the exposed of the RDL pattern 440 (in the area 475). The stud bumps 465 can be formed by electroplating the material for the stud bumps with a cladding as known in the art. In one aspect of the invention, the material for the stud bumps is Cu and the cladding is Pd. Alternatively, the stud bumps 465 can be formed by a wire bonding process as described above.

Figure 23:
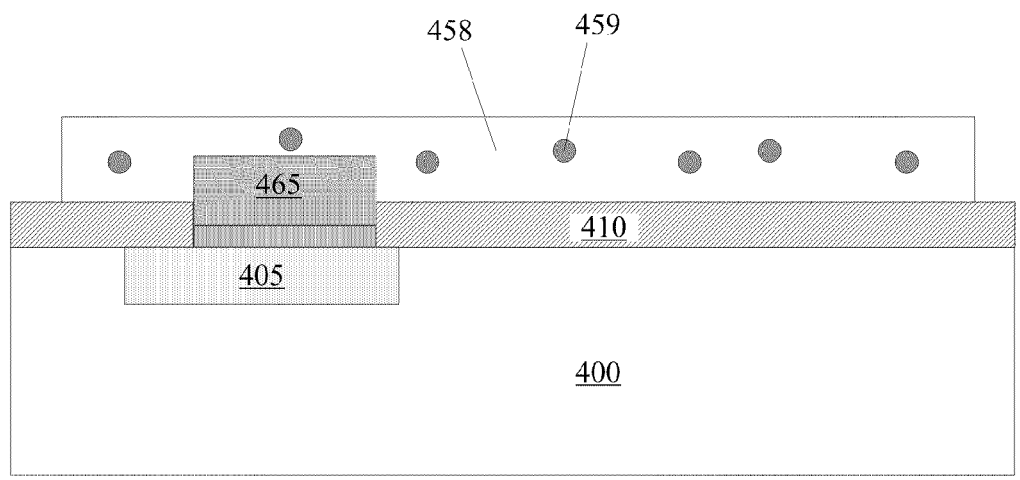
Figure 24:
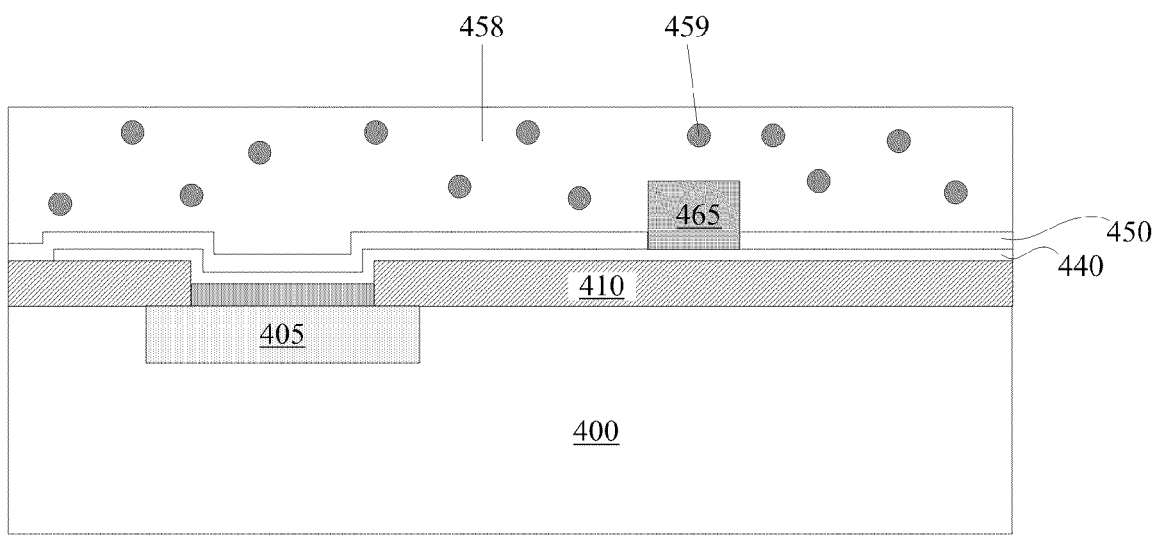

Next, as shown in FIGS. 23 and 24, an adhesive layer 458 containing conductive particles 459 is applied to the structures of FIGS. 21 and 22. The adhesive layer 458, as described herein, attaches the chip 400 and the substrate 101 while serving as a limited conductor. Any material functioning in this manner can be used as the adhesive layer 458, including an adhesive material with conductive particles therein. In one aspect of the invention, the adhesive layer 458 comprises an ACF (anisotropic conductive film), an ACP (anisotropic conductive paste) or ICP (isotropic conductive paste).

The adhesive layer 458 can be applied using any known mechanism in the art. For example, when ACP is used as the adhesive, the layer 458 can be applied by stencil printing. As another example, when ACF is used as the adhesive, the layer 458 can be applied by a film attach process.

Figure 26:
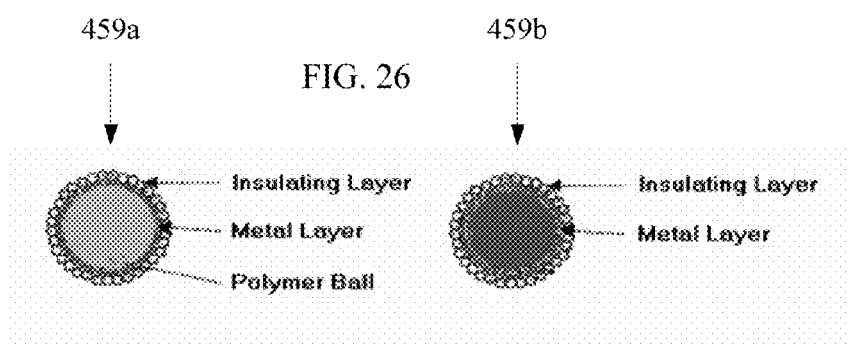

The conductive particles 459 can be any known in the art that can be used with the material of the adhesive. Examples of conductive particles that can be used in adhesive layer 458 are illustrated in FIG. 26. Conductive particle 459a comprises a polymer particle with a metal layer surrounded by an insulating layer. Conductive particle 459b comprises a metal particle surrounded by an insulating layer. The insulating layers in the conductive particles are broken—thereby creating a conductive path—when there is contact between the stud bumps and the substrate (as described below).

Next, substrate 101 with bond pads 201 (also called electrode pads) is provided. The bond pad 201 is that portion through which the substrate 101 is attached to the chip 400 containing studs 465. The bond pads 201 can be provided on the substrate 101 as known in the art. In one aspect of the invention, the bond pads are provided by a conventional deposition and etching process. The substrate 101 can be made of any suitable material. One example of a suitable material for the substrate is high glass-transition materials like bis-maleimide triazine (BT) epoxy.

Figure 25:
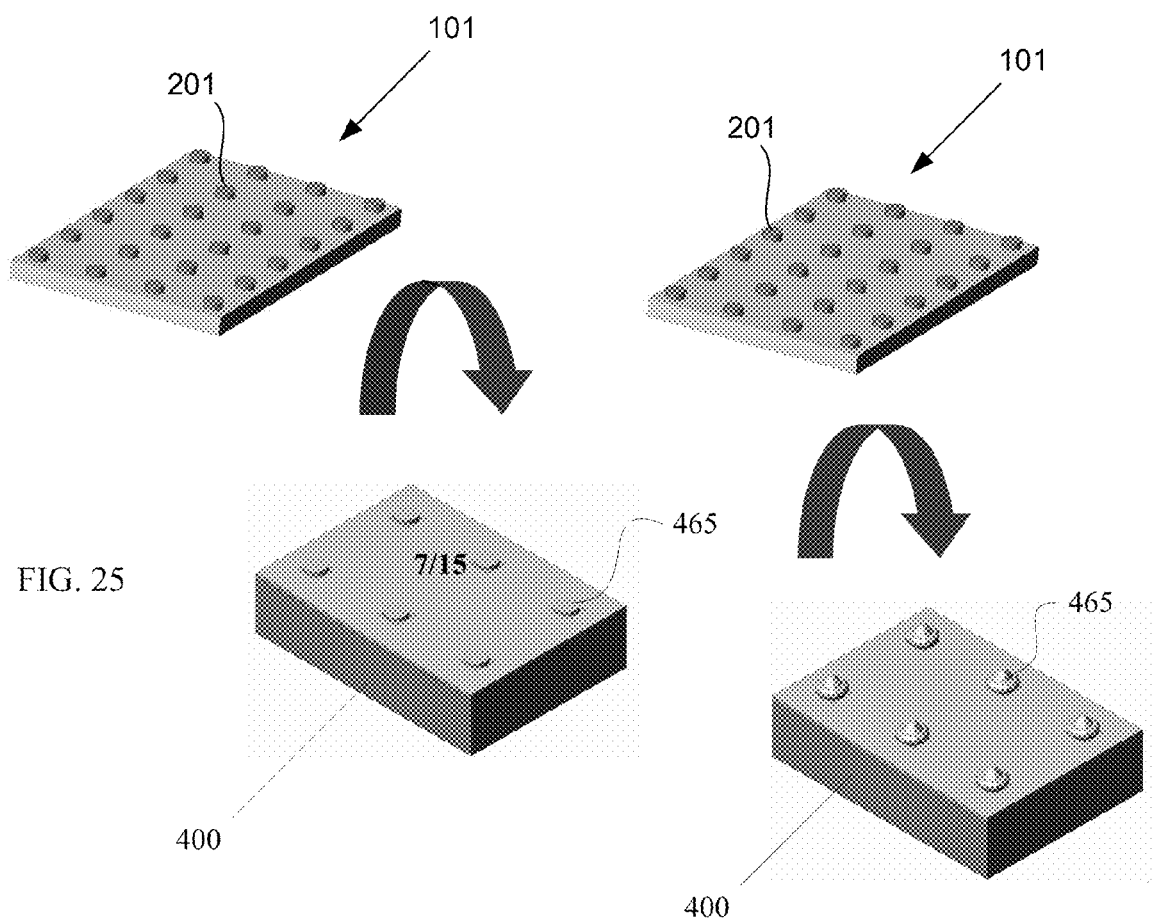

Next, any know flip chip procedure is used to attach the chip 400 and the substrate 101. In one aspect of the invention, chip 400 containing studs 465 is flipped and placed on the substrate 101 containing the adhesive 458. Alternatively, as depicted in FIG. 25, the adhesive layer 458 could be placed on the chip 400 and the substrate 101 flipped and placed on the chip 400. In yet another aspect of the invention, the adhesive layer can be formed on both the chip 400 and the substrate 100 before they are attached. When contacting the substrate 101 and the chip 400, the bond pads 201 and the studs 465 should be substantially aligned as known in the art.

Next, pressure is applied while the adhesive material is pre-cured, thereby preliminarily connecting chip 400 and substrate 101. The pressure in this process need only be enough to keep the chip 400 and substrate 101 together while the adhesive layer 458 is pre-cured. The pressure that is applied generally can range from about 2 to about 3 Kgf/cm$^2$ generally for about 0.2 to about 5 seconds.

The adhesive material is then finally cured by any mechanism in the art, which will depend on the material used. Generally, light and/or heat can be applied to cure the adhesive layer 458. In one aspect of the invention, the adhesive is cured by heating for a sufficient time (greater than about 20 seconds) and at a sufficient temperature (in the range of about 180 degrees Celsius) to finish the curing process.

Figure 27:
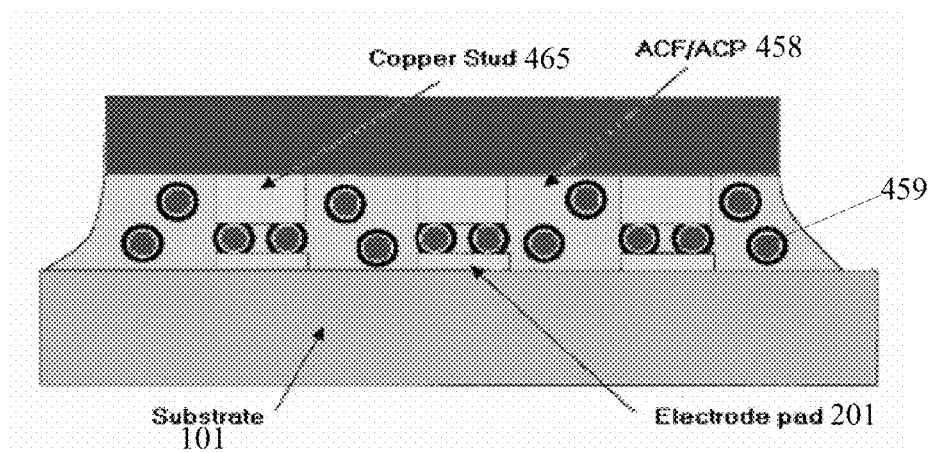

The adhesive layer 458 contains conductive particles 459 that will become positioned at intervals inside the adhesive layer 458. Thus, as illustrated in FIG. 27, when the chip 400 and the substrate 101 are attached, at least one conductive particle becomes located between the stud bumps 465 and the bond pads 201. Because the bulk of the adhesive layer 458 is not a conductive material, the only conduction between the chip 400 and the substrate 101 is through the conductive particles located between the stud bumps 465 and the bond pads 201.

Figure 28:
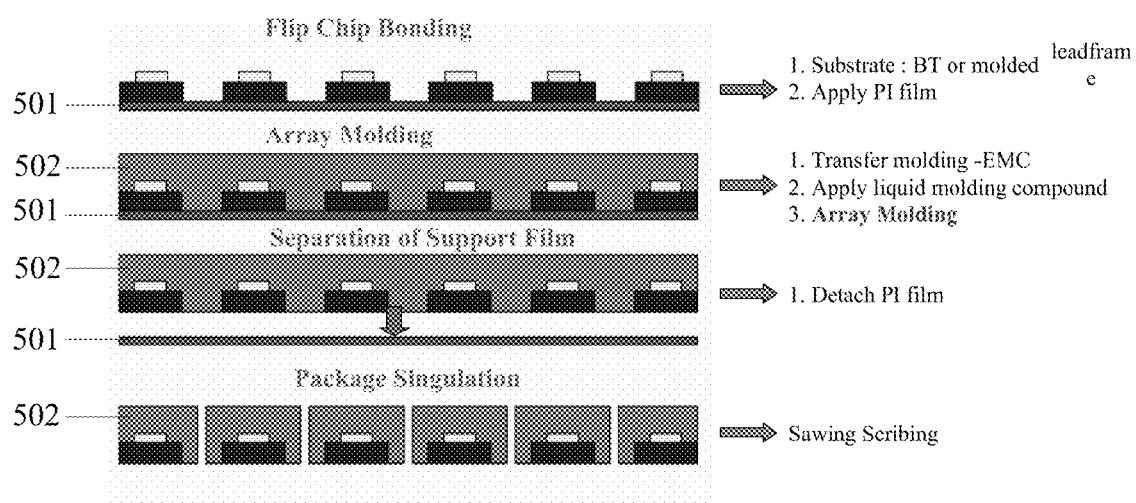

After the chip and the substrate have been attached to each other, the resulting structure is as depicted in FIG. 27. Then, this structure is encapsulated through any procedure known in the art. In one aspect of the invention, the encapsulation is carried out, as illustrated in FIG. 28, by first applying a support film 501 to the backside of the substrate 201. In one aspect of the invention, the support film is a polyimide (PI) film. Next, the molding compound 502 is applied by any known means, e.g., by transfer molding using an epoxy molding compound, by an applied liquid molding compound in a strip form, or by an array molding. After the molding compound is applied, the support film 501 is removed using any known process in the art.

After the molding process, the non-singulated semiconductor packages may be electrically tested. Parametric testing is performed while the semiconductor packages are in the form of a strip. After electrical testing, the molded molding material in the semiconductor packages may be laser marked. After laser marking, the semiconductor packages in the array of semiconductor package are singulated using any suitable process, such as by sawing and scribing.

Figure 29:
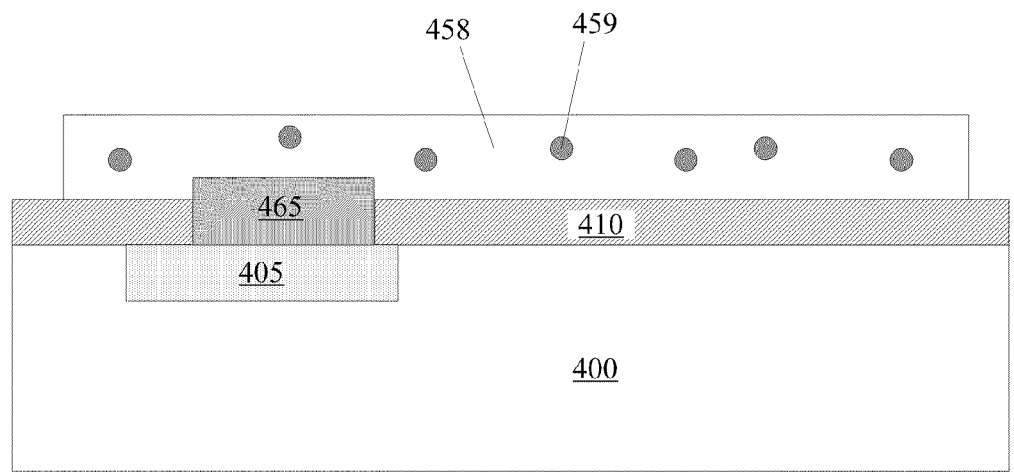
Figure 30:
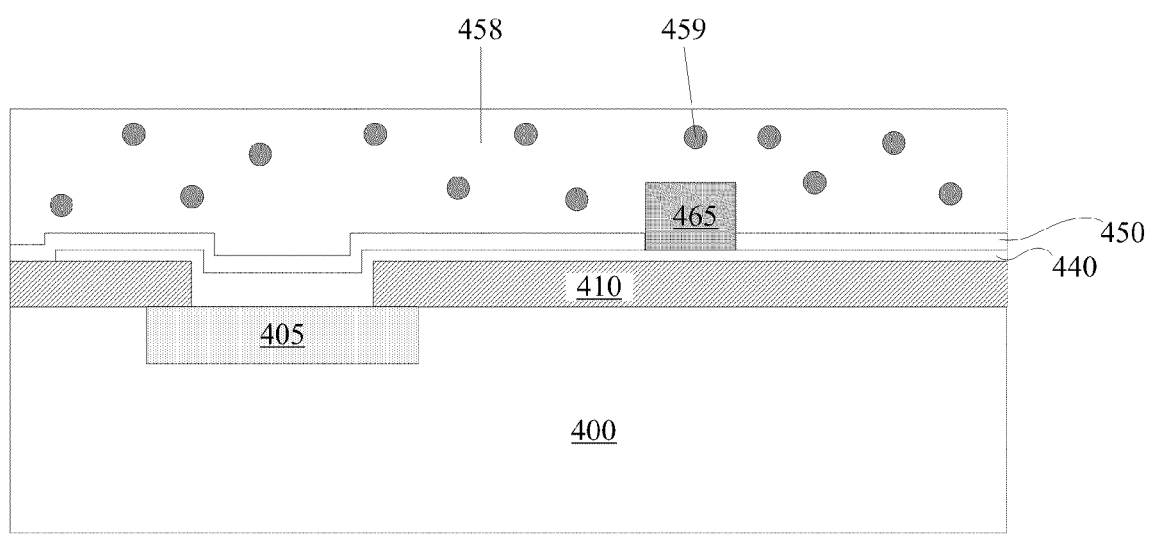
Figure 31:
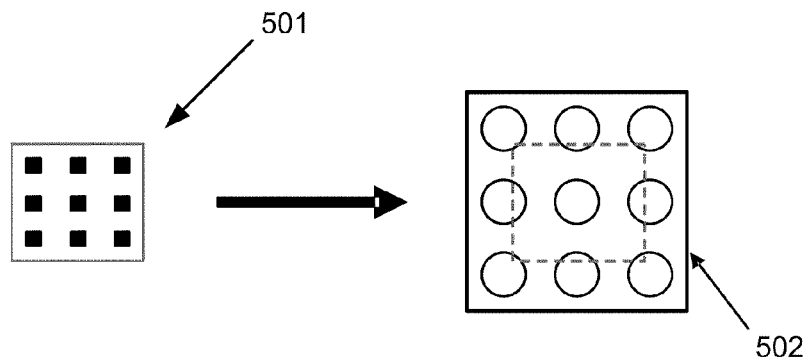

FIGS. 18-28 depicts the use of chip pad 415 in the WLCSP. In one aspect of the invention, the chip pad 415 can be eliminated. The chip pad is typically used to protect the chip (IC 405) during subsequent processing. Such a function can also be accomplished by the adhesive layer 458. Thus, in this aspect of the invention, the chip pad 415 can be eliminated as depicted in FIGS. 29-30.

In this aspect of the invention, the semiconductor packages have the following advantages. First, the semiconductor packages are more reliable. Known semiconductor packages made using by a flip chip method with an ACF were prone to fail for two reasons. First, formation of non-conductive film on either the contact area or on the conductive particles. Second, there was a loss of mechanical contact between the conductive elements due to either loss of adherence or relaxation of the compressive force. In the invention, these failure mechanisms are reduced or eliminated by encapsulation. The encapsulation reduces moisture attacks and oxidation of the conductive particles. The encapsulation also provides compressive residual stress on the ACF and reduces creep at high temperatures/times.

A second advantage is that the adhesive material (ACF and ACP) does not contain substantial amounts of lead and are, therefore, more environmentally friendly than solder. A third advantage is that the semiconductor packages of the invention offer higher resolution capability than those currently using solder paste because of the smaller particle size. A fourth advantage is that the semiconductor packages of the invention are cured at much lower temperatures than those required for soldering, thus reducing thermal stress and is better for thermally sensitive components and the substrate. A final advantage is that less process steps are needed as compared to soldering process, e.g., the flux and flux cleaning processes are not needed.

Figure 32:
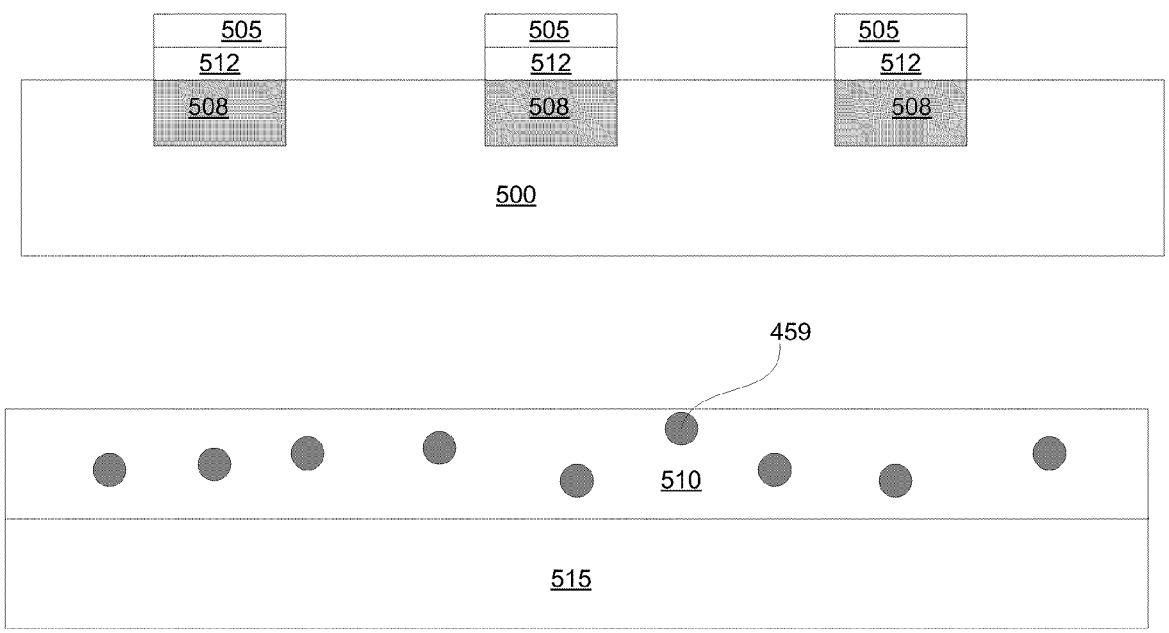

In yet another aspect of the invention, the wafer level chip scale package is manufactured in the manner depicted in FIGS. 32-39. In this aspect of the invention, and as illustrated in FIG. 32, a conductive substrate 515 (also referred to as "substrate" or "substrate 515") is provided. In this aspect of the invention, conductive substrate 515 serves as a substrate for the adhesive layer as described below and comprises a material that is later used to form conductive signal traces as described below, as well as a substrate. Thus, the substrate 515 can be formed using any material that serves these functions. In one aspect of the invention, the substrate 515 is formed from a conductive material like metallic foil or metallic alloy foil, such as Cu or Al. In one aspect of the invention, the substrate 515 comprises Cu foil. In another aspect of the invention, the Cu foil is a Cu foil with a weight sufficient for handling and stability and that is able to carry a reasonable amount of current. Generally, the CU foil can be about 0.5 to about 2 oz. In one aspect of the invention, the Cu foil is a 2 oz foil. Optionally, the handling and stability of the Cu foil can be increased by using a polymeric adhesive such as a B-stage polymer on the back side of the Cu foil. In another aspect of the invention, the substrate could comprise a plurality of metallic foil layers.

The conductive substrate 515 can have any thickness consistent with its functions described above. Generally, the thickness of the substrate can range from about 70 to about 300 micrometers. In one aspect of the invention, such as when Cu foil is used, the thickness of the substrate 515 is about 70 micrometers.

As shown in FIG. 32, an adhesive layer 510 containing conductive particles 559 is applied to the conductive substrate 515. The adhesive layer 510, as described herein, attaches the substrate 515 to the die 500 (as described below) while also serving as a limited conductor. Any material functioning in this manner can be used as the adhesive layer 510, including an adhesive material with conductive particles therein, as well as those materials described above for adhesive layer 458. In one aspect of the invention, the adhesive material can have the form of a liquid (such as a paste like an ACP or ICP) or a solid (such as a film like ACF). Both the liquid form and the solid form of the adhesive material contain substantially the same composition (in terms of conductive particles, resin, hardener, etc. . . . ), but have differing amounts of diluent (i.e., low amounts of diluent for the solid and higher amounts for the liquid). Since the diluent evaporates during subsequent processing, both the liquid form and solid form of the adhesive material can be used in the invention.

The adhesive layer 510 can be applied using any known mechanism in the art. For example, when ACP is used as the adhesive, the layer 510 can be applied by stencil printing. As another example, when ACF is used as the adhesive, the layer 510 can be applied by a film attach process.

The conductive particles 459 can be any known in the art that can be used with the material of the adhesive. Examples of conductive particles that can be used in adhesive layer 510 are illustrated in FIG. 26. Conductive particle 459a comprises a polymer particle with a metal layer surrounded by an insulating layer. Conductive particle 459b comprises a metal particle surrounded by an insulating layer. The insulating layers in the conductive particles are broken—thereby creating a conductive path—when there is contact between the stud bumps and the substrate (as described above). Generally, the conductive particles comprise about 1 to about 40 wt % of the adhesive material. In one aspect of the invention, the conductive particles comprise about 4 to about 20 wt % of the adhesive material.

The content, size, and specie of conductive particle—and therefore the amount of conductivity in the adhesive layer 510—can be designed for the specific type of device that is desired. Thus, the insulation resistance of the adhesive layer 510 can be adjusted from about $10^8$ cm$\Omega$ (for particles containing about 20% Au with a pitch of less than 30) to about $10^{15}$ cm$\Omega$ or more (for particles containing about 4% Ni).

The adhesive layer 510 can have any thickness consistent with its functions described above. Generally, the thickness of the adhesive layer 510 can range from about 5 to about 200 micrometers. In one aspect of the invention, such as when ACF made of epoxy or an acryl based material containing conductive filler is used, the thickness of the adhesive layer 510 can range from about 25 to about 50 micrometers. The adhesive layer should match the height of the bumps on the die.

As shown in FIG. 32, a die 500 is then provided. Die (or chip) 500 can be any conventional die as known in the art. An optional passivation layer (substantially similar to passivation layer 110) can then be formed on die. When used, a portion of the passivation layer is then removed in the area of integrated circuit 508 and a chip pad 512 is formed in that exposed portion. The methods used for these processes are substantially similar to those described above.

Then studs (or stud bumps) 505 are formed. As depicted in FIG. 32, the studs 505 are respectively formed on the chip pad 512. The studs 505 can be formed by electroplating the material for the studs with a cladding as known in the art. In one aspect of the invention, the material for the stud bumps is Cu and the cladding is Pd. Alternatively, the studs 505 can be formed by a wire bonding process as described above.

Next, any know flip chip procedure is used to attach the die 500 (containing studs 505) and the conductive substrate 515 with the adhesive layer 510 thereon. In one aspect of the invention, die 500 containing studs 505 is flipped and placed on the substrate 515 containing the adhesive layer 510. Alternatively, as described above, the adhesive layer 510 could be placed on the die 500 containing the studs 505 and the substrate 515 flipped and placed thereon. In yet another aspect of the invention, the adhesive layer 510 can be formed on both the die 500 and the substrate 515 before they are attached.

Next, pressure is applied while the adhesive material is pre-cured, thereby preliminarily connecting die 500 and substrate 515. The pressure in this process need only be enough to keep these two components together while the adhesive layer 510 is pre-cured. The pressure that is applied generally can range from about 2 to about 3 Kgf/cm$^2$ and generally is applied for about 0.2 to about 5 seconds.

The adhesive material is then finally cured by any mechanism in the art, which will depend on the material used. Generally, light and/or heat can be applied to cure the adhesive layer 510. In one aspect of the invention, the adhesive is cured by heating for a sufficient time (greater than about 20 seconds) and at a sufficient temperature (in the range of about 180 degrees Celsius) to finish the curing process.

Figure 33:
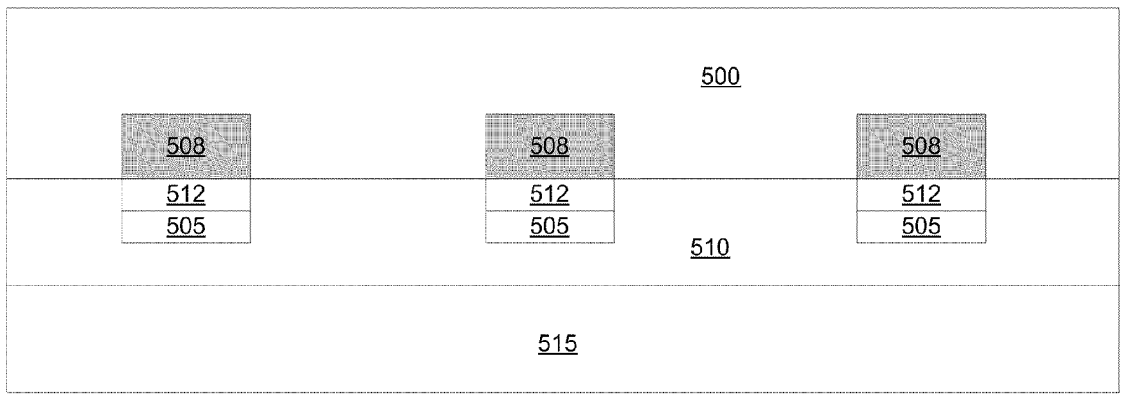
Figure 34:
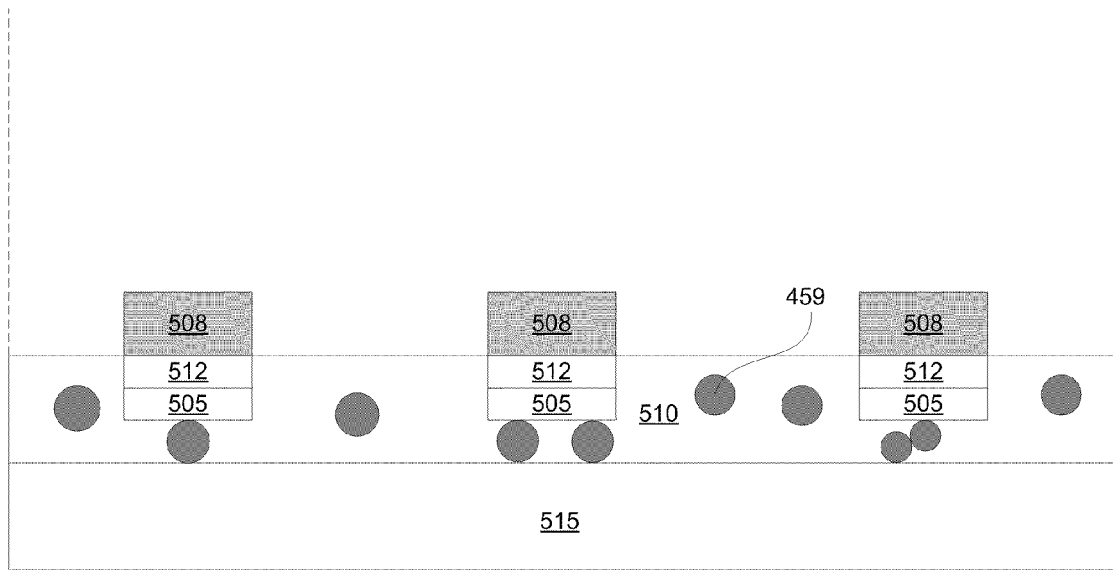

After this thermo-compression bonding process, the die 500 and substrate 515 are connected both electrically and mechanically as shown in FIG. 33. The adhesive layer 510 contains conductive particles 459 that will become positioned at intervals inside the adhesive layer 458. Thus, as illustrated in FIG. 34, when the die 500 and the substrate 515 are attached, at least one conductive particle becomes located between the studs 505 and the substrate 515. Because the bulk of the adhesive layer 510 is not a conductive material, substantially the only conduction between the die 500 and the substrate 515 is through the conductive particles.

Figure 35:
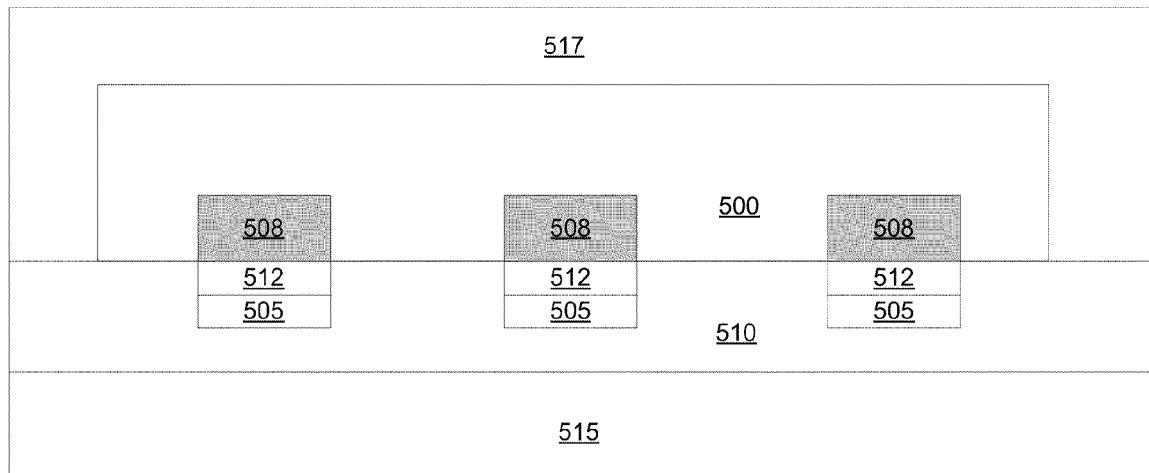
Figure 36:
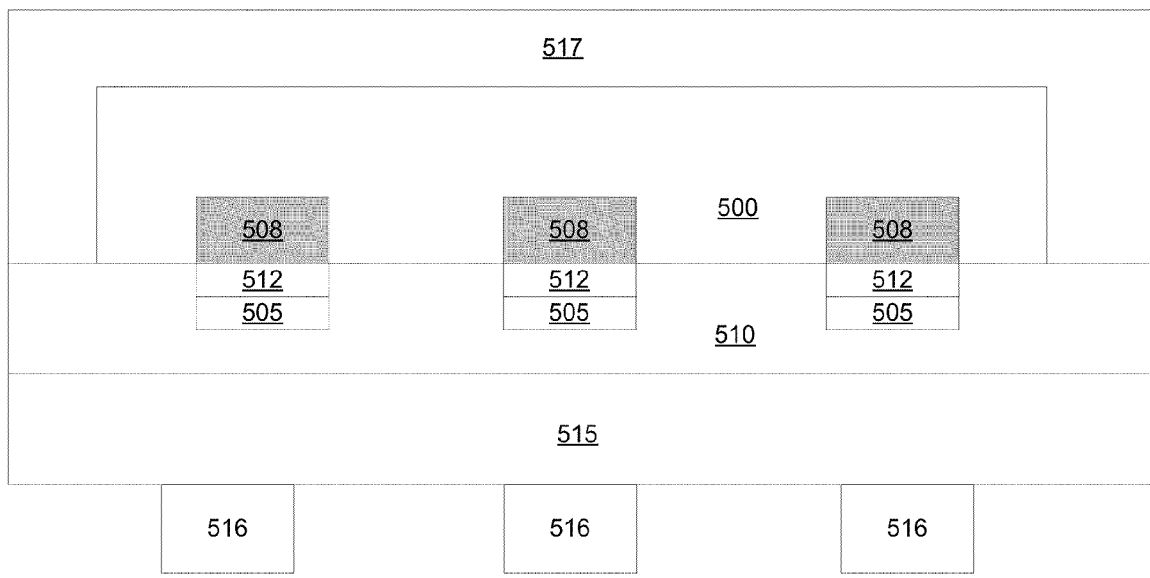

After the die and the substrate have been attached to each other, the resulting structure is as depicted in FIG. 33. Then this structure is encapsulated through any procedure known in the art. In one aspect of the invention, the encapsulation is carried out, as illustrated in FIG. 35, by any overmolding process known in the art. See, for example, the process described in U.S. Pat. No. 6,537,853, the disclosure of which is incorporated herein by reference. In one aspect of the invention, the overmolding process includes those molding processes described above.

Figure 37:
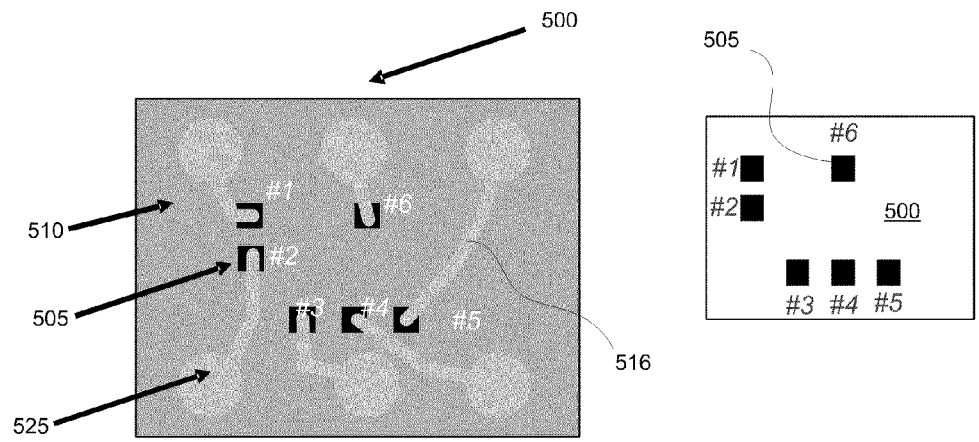
Figure 38:
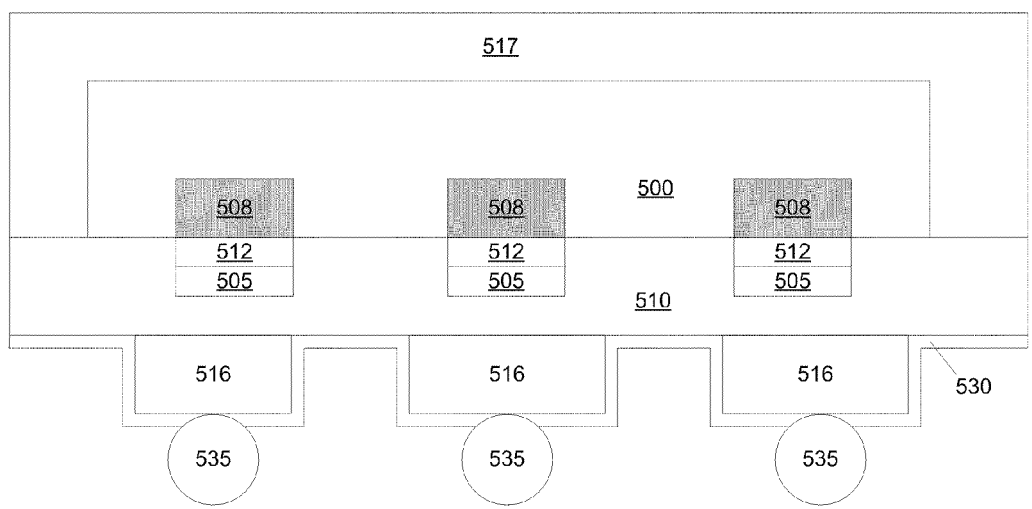

After the molding process that forms encapsulation 517, the substrate 515 is then etched to form the electrical signal traces. Any etching process known in the art can be used to etch the substrate 515 to form the signal traces 516. In one aspect of the invention, the etching is performed by conventional process which comprise of photoresist coating, developing, etching and stripping. In another aspect of the invention, the etching process is performed so the patterned substrate acts a redistribution layer that converts the dense pad layout formed on the die 500 to a larger pitch lay out needed for the circuit board. As shown in FIG. 37, the patterned substrate redistributes the electrical signal from the die pad locations 505 to the locations 525 where the solder balls will be located and used for mounting on a circuit board.

In one aspect of the invention, the traces 516 comprising the patterned substrate are then plated. This plating process places a conductive layer over the traces to protect the patterned substrate from oxidation. Any conductive material that serves this purpose can be used in the invention, such as Au, Ni, Pd, and combinations or alloys thereof. In one aspect of the invention, a Ni/Pd alloy is used as the material for the plating.

Next, a solder resist layer 530 is optionally formed on the resulting structure. Because the adhesive layer 510 could have a high moisture absorption, the solder resist 530 layer can protect the adhesive layer 510 from moisture and the outside impact could be printed on the patterned substrate 515 to exclude the region for solder ball attach. If desired, the solder balls 535 can then be attached through any process known in the art, as well as those described above.

Figure 39:
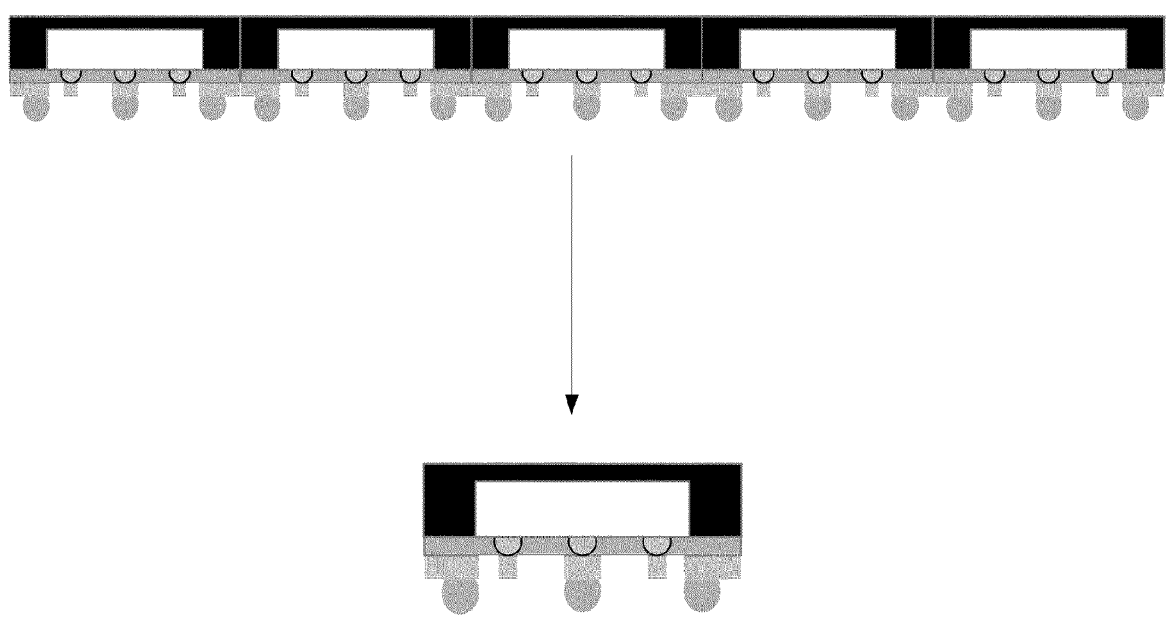

Next, the non-singulated semiconductor packages may be electrically tested. Parametric testing is performed while the semiconductor packages are in the form of a strip. After electrical testing, the molded molding material in the semiconductor packages may be laser marked. After laser marking, the semiconductor packages in the array of semiconductor package are singulated as shown in FIG. 39 using any suitable process, such as by sawing and scribing.

In this aspect of the invention, the semiconductor packages have the following advantages. First, the semiconductor packages are formed using a simple process. Second, the conductive substrate attached to the die also serves as a redistribution layer. Third, the same die can be used both in wire bonding packages and in flip chip bonding packaging without any modification. Fourth, the cost for production (especially for assembly) is much lower than the cost for conventional WLCSP. Finally, the decrease in the size of the package is quite substantial. For example, die sizes of 1.9 mm×2.5 mm typically require a package with a size of about 4 mm×4 mm. Using the invention, the same die size would only require package size of about 3 mm×2.5 mm or less.

Having described these aspects of the invention, it is understood that the invention defined by the appended claims is not to be limited by particular details set forth in the above description, as many apparent variations thereof are possible without departing from the spirit or scope thereof.

We claim:

1. A method for making wafer-level chip scale package, comprising:
   providing a chip containing a stud bump;
   providing at least one metallic foil;
   attaching the chip to the at least one metallic foil using an adhesive material containing conductive particles;
   encapsulating the chip except for the surface of the chip attached to the at least one metallic foil; and
   then patterning the at least one metallic foil to form a plurality of conductive traces while the plurality of conductive traces are mechanically supported by the adhesive material.

2. The method of claim 1, wherein the adhesive material comprises an anisotropic conductive film, an anisotropic conductive paste, or an isotropic conductive paste.

3. The method of claim 1, wherein the plurality of conductive traces serves as a redistribution layer.

4. A method for making wafer-level chip scale package, comprising:
   providing a chip with a stud bump;
   providing a at least one metallic foil;
   providing an adhesive material containing conductive particles on the chip, the at least one metallic foil, or both;
   pressing the chip and the at least one metallic foil together;
   curing the adhesive material;
   encapsulating the chip except for the surface of the chip attached to the at least one metallic foil; and
   then patterning the at least one metallic foil to form a plurality of conductive traces while the plurality of conductive traces are mechanically supported by the adhesive material.

5. The method of claim 4 further comprising providing the chip with a chip pad.

6. The method of claim 4, in eluding providing at least one conductive particle between the stud bump arid the at least one metallic foil.

7. The method of claim 4, wherein the adhesive material comprises an anisotropic conductive film, an anisotropic conductive paste, or an isotropic conductive paste.

8. The method of claim 4, wherein the curing the adhesive material electrically and mechanically connects the chip to the at least one metallic foil.

9. The method of claim 4, wherein the plurality of conductive traces serves as a redistribution layer.

10. The method of claim 4, wherein the stud bump comprises Cu.

11. A method of fabricating a wafer-level chip scale package, the method comprising:
    providing a substrate having at least one die having a surface where conductive bumps are formed;
    disposing an adhesive layer on the substrate to contact the adhesive layer to the surface of the at least one die, the adhesive layer comprising conductive particles therein, the conductive particles comprising metal with a breakable insulating coating thereon;
    bonding at least one metallic foil to the adhesive layer so as to connect the at least one metallic foil electrically to the conductive bumps through the conductive particles;
    encapsulating the at least one metallic foil except the surface of the at least one die
    then patterning the at least one metallic foil to form a plurality of conductive trace on the adhesive layer while the plurality of conductive traces are mechanically supported by the adhesive material; and
    forming conductive bumps on the plurality of conductive traces.

12. The method of claim 11, further comprising encapsulating the chip except for the surfaces of the chip attached to the at least one metallic foil.

13. The method of claim 11, including providing at least one conductive particle between the stud bump and the at least one metallic foil.

14. The method of claim 11, wherein the adhesive material comprises an anisotropic conductive film, an anisotropic conductive paste, or an isotropic conductive paste.

15. The method of claim 11, wherein the stud bump comprises Cu.

* * * * *